United States Patent
Hall et al.

(10) Patent No.: US 9,563,218 B2
(45) Date of Patent: *Feb. 7, 2017

(54) ELECTRIC POWER SYSTEM CONTROL WITH MEASUREMENT OF ENERGY DEMAND AND ENERGY EFFICIENCY USING T-DISTRIBUTIONS

(71) Applicant: Dominion Resources, Inc., Richmond, VA (US)

(72) Inventors: Edmund J. Hall, Louisa County, VA (US); Stephen J. Tyler, Henrico County, VA (US)

(73) Assignee: Dominion Resources, Inc., Richmond, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/193,980

(22) Filed: Feb. 28, 2014

(65) Prior Publication Data

US 2014/0277814 A1    Sep. 18, 2014

Related U.S. Application Data

(60) Provisional application No. 61/789,085, filed on Mar. 15, 2013.

(51) Int. Cl.
*G05D 3/12* (2006.01)
*G05D 5/00* (2006.01)
(Continued)

(52) U.S. Cl.
CPC ............... *G05F 1/66* (2013.01); *G01R 21/00* (2013.01); *H02J 3/14* (2013.01); *H02J 3/24* (2013.01);
(Continued)

(58) Field of Classification Search
CPC ......... G05B 11/01; G06F 19/00; G01R 21/06; G05D 11/00
(Continued)

(56) References Cited

U.S. PATENT DOCUMENTS 3,900,842 A    8/1975    Calabro et al.
3,970,898 A    7/1976    Baumann et al.
(Continued)

FOREIGN PATENT DOCUMENTS

EA           9685         2/2008
EP      0020310 A1      12/1980
(Continued)

OTHER PUBLICATIONS

Paseraba, J., Secondary Voltage-Var Controls Applied to Static Compensators (STATCOMs) for Fast Voltage Control and Long Term Var Management, 2002 IEEE Power Engineering Society Summer Meeting. Jul. 25, 2002. Chicago, IL, vol. 2 pp. 753-761 <DOI: 10.1109/PESS.2002.1043415>.
(Continued)

*Primary Examiner* — Mohammad Ali
*Assistant Examiner* — Ziaul Karim
(74) *Attorney, Agent, or Firm* — Blank Rome LLP

(57) ABSTRACT

A method, apparatus, system and computer program is provided for controlling an electric power system, including implementation of voltage measurement using paired t statistical analysis applied to calculating a shift in average usage per customer from one time period to another time period for a given electrical use population where the pairing process is optimized using a novel technique to improve the accuracy of the statistical measurement.

68 Claims, 15 Drawing Sheets

(51) Int. Cl.
  *G05F 1/66* (2006.01)
  *G01R 21/00* (2006.01)
  *H02J 3/14* (2006.01)
  *H02J 3/24* (2006.01)
  *H02J 13/00* (2006.01)
  *H02J 3/00* (2006.01)

(52) U.S. Cl.
  CPC ......... *H02J 13/0062* (2013.01); *H02J 13/0075* (2013.01); *H02J 2003/003* (2013.01); *Y02B 70/3225* (2013.01); *Y02E 40/76* (2013.01); *Y04S 10/54* (2013.01); *Y04S 10/545* (2013.01); *Y04S 20/222* (2013.01)

(58) Field of Classification Search
  USPC ................................. 700/295, 296, 297, 298
  See application file for complete search history.

(56) References Cited

U.S. PATENT DOCUMENTS

| | | |
|---|---|---|
| 4,054,830 A | 10/1977 | Harrel |
| 4,234,904 A | 11/1980 | Fahlesson |
| 4,291,377 A | 9/1981 | Schneider et al. |
| 4,302,750 A | 11/1981 | Wadhwani et al. |
| 4,307,380 A | 12/1981 | Gander |
| 4,309,655 A | 1/1982 | Lienhard et al. |
| 4,310,829 A | 1/1982 | Rey |
| 4,356,553 A | 10/1982 | Steinle et al. |
| 4,361,872 A | 11/1982 | Spalti |
| 4,365,302 A | 12/1982 | Elms |
| 4,434,400 A | 2/1984 | Halder |
| 4,513,273 A | 4/1985 | Friedl |
| 4,525,668 A | 6/1985 | Lienhard et al. |
| 4,540,931 A | 9/1985 | Hahn |
| 4,630,220 A | 12/1986 | Peckinpaugh |
| 4,686,630 A | 8/1987 | Marsland et al. |
| 4,689,752 A | 8/1987 | Fernandes et al. |
| 4,695,737 A | 9/1987 | Rabon et al. |
| 4,791,520 A | 12/1988 | Stegmuller |
| 4,843,310 A | 6/1989 | Friedl |
| 4,853,620 A | 8/1989 | Halder et al. |
| 4,881,027 A | 11/1989 | Joder et al. |
| 4,887,028 A | 12/1989 | Voisine et al. |
| 4,894,610 A | 1/1990 | Friedl |
| 4,896,106 A | 1/1990 | Voisine et al. |
| 5,028,862 A | 7/1991 | Roth |
| 5,032,785 A | 7/1991 | Mathis et al. |
| 5,055,766 A | 10/1991 | McDermott et al. |
| 5,066,906 A | 11/1991 | Moore |
| 5,124,624 A | 6/1992 | De Vries et al. |
| 5,128,855 A | 7/1992 | Hilber et al. |
| 5,136,233 A | 8/1992 | Klinkenberg et al. |
| 5,231,347 A | 7/1993 | Voisine et al. |
| 5,249,150 A | 9/1993 | Gruber et al. |
| 5,262,715 A | 11/1993 | King et al. |
| 5,270,639 A | 12/1993 | Moore |
| 5,272,462 A | 12/1993 | Teyssandier et al. |
| 5,298,857 A | 3/1994 | Voisine et al. |
| 5,343,143 A | 8/1994 | Voisine et al. |
| 5,422,561 A * | 6/1995 | Williams ............... H02J 3/1821 307/31 |
| 5,432,507 A | 7/1995 | Mussino et al. |
| 5,466,973 A | 11/1995 | Griffioen |
| 5,475,867 A | 12/1995 | Blum |
| 5,511,108 A | 4/1996 | Severt et al. |
| 5,552,696 A | 9/1996 | Trainor et al. |
| 5,602,750 A | 2/1997 | Severt et al. |
| 5,604,414 A | 2/1997 | Milligan et al. |
| 5,610,394 A | 3/1997 | Lee |
| 5,627,759 A | 5/1997 | Bearden et al. |
| 5,646,512 A | 7/1997 | Beckwith |
| 5,673,252 A | 9/1997 | Johnson et al. |
| 5,736,848 A | 4/1998 | De Vries et al. |
| 5,903,548 A | 5/1999 | Delamater |
| 5,918,380 A | 7/1999 | Schleich et al. |
| 5,963,146 A | 10/1999 | Johnson et al. |
| 6,006,212 A | 12/1999 | Schleich et al. |
| 6,026,355 A | 2/2000 | Rahman et al. |
| 6,172,616 B1 | 1/2001 | Johnson et al. |
| 6,218,995 B1 | 4/2001 | Higgins et al. |
| 6,219,655 B1 | 4/2001 | Schleich et al. |
| 6,333,975 B1 | 12/2001 | Brunn et al. |
| 6,373,236 B1 | 4/2002 | Lemay, Jr. et al. |
| 6,373,399 B1 | 4/2002 | Johnson et al. |
| 6,417,729 B1 | 7/2002 | Lemay et al. |
| 6,555,997 B1 | 4/2003 | De Vries et al. |
| 6,590,376 B1 | 7/2003 | Bammert et al. |
| 6,618,684 B1 | 9/2003 | Beroset et al. |
| 6,628,207 B1 | 9/2003 | Hemminger et al. |
| 6,633,823 B2 | 10/2003 | Bartone et al. |
| 6,636,893 B1 | 10/2003 | Fong |
| 6,650,249 B2 | 11/2003 | Meyer et al. |
| 6,653,945 B2 | 11/2003 | Johnson et al. |
| 6,667,692 B2 | 12/2003 | Griffin |
| 6,684,245 B1 | 1/2004 | Shuey et al. |
| 6,700,902 B1 | 3/2004 | Meyer |
| 6,703,823 B1 | 3/2004 | Hemminger et al. |
| 6,738,693 B2 | 5/2004 | Anderson |
| 6,747,446 B1 | 6/2004 | Voisine |
| 6,747,981 B2 | 6/2004 | Ardalan et al. |
| 6,756,914 B1 | 6/2004 | Fitzgerald et al. |
| 6,757,628 B1 | 6/2004 | Anderson et al. |
| 6,762,598 B1 | 7/2004 | Hemminger et al. |
| 6,773,652 B2 | 8/2004 | Loy et al. |
| 6,778,099 B1 | 8/2004 | Meyer et al. |
| 6,798,353 B2 | 9/2004 | Seal et al. |
| 6,815,942 B2 | 11/2004 | Randall et al. |
| 6,816,538 B2 | 11/2004 | Shuey et al. |
| 6,832,135 B2 | 12/2004 | Ying |
| 6,832,169 B2 | 12/2004 | Wakida et al. |
| 6,838,867 B2 | 1/2005 | Loy |
| 6,847,201 B2 | 1/2005 | De Vries et al. |
| 6,859,186 B2 | 2/2005 | Lizalek et al. |
| 6,859,742 B2 | 2/2005 | Randall et al. |
| 6,867,707 B1 | 3/2005 | Kelley et al. |
| 6,868,293 B1 | 3/2005 | Schurr et al. |
| 6,873,144 B2 | 3/2005 | Slater et al. |
| 6,882,137 B1 | 4/2005 | Voisine |
| 6,885,185 B1 | 4/2005 | Makinson et al. |
| 6,888,876 B1 | 5/2005 | Mason et al. |
| 6,892,144 B2 | 5/2005 | Slater et al. |
| 6,900,737 B1 | 5/2005 | Ardalan et al. |
| 6,906,507 B2 | 6/2005 | Briese et al. |
| 6,906,637 B2 | 6/2005 | Martin |
| 6,940,268 B2 | 9/2005 | Hemminger et al. |
| 6,940,711 B2 | 9/2005 | Heuell et al. |
| 6,947,854 B2 | 9/2005 | Swarztrauber et al. |
| 6,954,061 B2 | 10/2005 | Hemminger et al. |
| 6,982,390 B2 | 1/2006 | Heuell et al. |
| 6,988,043 B1 | 1/2006 | Randall |
| 6,989,667 B2 | 1/2006 | Loy |
| 6,995,685 B2 | 2/2006 | Randall |
| 7,005,844 B2 | 2/2006 | De Vries et al. |
| 7,009,379 B2 | 3/2006 | Ramirez |
| 7,020,178 B2 | 3/2006 | Mason et al. |
| 7,043,381 B2 | 5/2006 | Wakida et al. |
| 7,046,682 B2 | 5/2006 | Carpenter et al. |
| 7,064,679 B2 | 6/2006 | Ehrke et al. |
| 7,069,117 B2 | 6/2006 | Wilson et al. |
| 7,075,288 B2 | 7/2006 | Martin et al. |
| 7,079,962 B2 | 7/2006 | Cornwall et al. |
| 7,084,783 B1 | 8/2006 | Melvin et al. |
| 7,089,125 B2 | 8/2006 | Sonderegger |
| 7,091,878 B2 | 8/2006 | Holle et al. |
| 7,109,882 B2 | 9/2006 | Angelis |
| 7,112,949 B2 | 9/2006 | Voisine |
| 7,116,243 B2 | 10/2006 | Schleich et al. |
| 7,119,698 B2 | 10/2006 | Schleich et al. |
| 7,119,713 B2 | 10/2006 | Shuey et al. |
| 7,126,493 B2 | 10/2006 | Junker |
| 7,126,494 B2 | 10/2006 | Ardalan et al. |
| 7,135,850 B2 | 11/2006 | Ramirez |
| 7,142,106 B2 | 11/2006 | Scoggins |

(56) References Cited

U.S. PATENT DOCUMENTS

| | | |
|---|---|---|
| 7,145,474 B2 | 12/2006 | Shuey et al. |
| 7,149,605 B2 | 12/2006 | Chassin et al. |
| 7,154,938 B2 | 12/2006 | Cumeralto et al. |
| 7,161,455 B2 | 1/2007 | Tate et al. |
| 7,167,804 B2 | 1/2007 | Fridholm et al. |
| 7,168,972 B1 | 1/2007 | Autry et al. |
| 7,170,425 B2 | 1/2007 | Christopher et al. |
| 7,176,807 B2 | 2/2007 | Scoggins et al. |
| 7,180,282 B2 | 2/2007 | Schleifer |
| 7,187,906 B2 | 3/2007 | Mason et al. |
| 7,196,673 B2 | 3/2007 | Savage et al. |
| 7,209,049 B2 | 4/2007 | Dusenberry et al. |
| 7,218,998 B1 | 5/2007 | Neale |
| 7,224,158 B2 | 5/2007 | Petr |
| 7,227,350 B2 | 6/2007 | Shuey |
| 7,230,972 B2 | 6/2007 | Cornwall et al. |
| 7,236,498 B1 | 6/2007 | Moos et al. |
| 7,236,908 B2 | 6/2007 | Timko et al. |
| 7,239,125 B2 | 7/2007 | Hemminger et al. |
| 7,239,250 B2 | 7/2007 | Brian et al. |
| 7,245,511 B2 | 7/2007 | Lancaster et al. |
| 7,262,709 B2 | 8/2007 | Borleske et al. |
| 7,274,187 B2 | 9/2007 | Loy |
| 7,277,027 B2 | 10/2007 | Ehrke et al. |
| 7,283,062 B2 | 10/2007 | Hoiness et al. |
| 7,283,580 B2 | 10/2007 | Cumeralto et al. |
| 7,283,916 B2 | 10/2007 | Cahill-O'Brien et al. |
| 7,298,134 B2 | 11/2007 | Weikel et al. |
| 7,298,135 B2 | 11/2007 | Briese et al. |
| 7,301,476 B2 | 11/2007 | Shuey et al. |
| 7,308,369 B2 | 12/2007 | Rudran et al. |
| 7,308,370 B2 | 12/2007 | Mason et al. |
| 7,312,721 B2 | 12/2007 | Mason et al. |
| 7,315,162 B2 | 1/2008 | Shuey |
| 7,317,404 B2 | 1/2008 | Cumeralto et al. |
| 7,327,998 B2 | 2/2008 | Kumar et al. |
| 7,336,200 B2 | 2/2008 | Osterloh et al. |
| 7,339,805 B2 | 3/2008 | Hemminger et al. |
| 7,346,030 B2 | 3/2008 | Cornwall |
| 7,348,769 B2 | 3/2008 | Ramirez |
| 7,355,867 B2 | 4/2008 | Shuey |
| 7,362,232 B2 | 4/2008 | Holle et al. |
| 7,362,236 B2 | 4/2008 | Hoiness |
| 7,365,687 B2 | 4/2008 | Borleske et al. |
| 7,417,420 B2 | 8/2008 | Shuey |
| 7,417,557 B2 | 8/2008 | Osterloh et al. |
| 7,421,205 B2 | 9/2008 | Ramirez |
| 7,427,927 B2 | 9/2008 | Borleske et al. |
| 7,453,373 B2 | 11/2008 | Cumeralto et al. |
| 7,471,516 B2 | 12/2008 | Voisine |
| 7,479,895 B2 | 1/2009 | Osterloh et al. |
| 7,486,056 B2 | 2/2009 | Shuey |
| 7,495,578 B2 | 2/2009 | Borleske |
| 7,504,821 B2 | 3/2009 | Shuey |
| 7,505,453 B2 | 3/2009 | Carpenter et al. |
| 7,510,422 B2 | 3/2009 | Showcatally et al. |
| 7,516,026 B2 | 4/2009 | Cornwall et al. |
| 7,535,378 B2 | 5/2009 | Cornwall |
| 7,540,766 B2 | 6/2009 | Makinson et al. |
| 7,545,135 B2 | 6/2009 | Holle et al. |
| 7,545,285 B2 | 6/2009 | Shuey et al. |
| 7,561,062 B2 | 7/2009 | Schleich et al. |
| 7,561,399 B2 | 7/2009 | Slater et al. |
| 7,583,203 B2 | 9/2009 | Uy et al. |
| 7,584,066 B2 | 9/2009 | Roytelman |
| 7,616,420 B2 | 11/2009 | Slater et al. |
| 7,626,489 B2 | 12/2009 | Berkman et al. |
| 7,630,863 B2 | 12/2009 | Zweigle et al. |
| 7,639,000 B2 | 12/2009 | Briese et al. |
| 7,656,649 B2 | 2/2010 | Loy et al. |
| 7,671,814 B2 | 3/2010 | Savage et al. |
| 7,683,642 B2 | 3/2010 | Martin et al. |
| 7,688,060 B2 | 3/2010 | Briese et al. |
| 7,688,061 B2 | 3/2010 | Briese et al. |
| 7,696,941 B2 | 4/2010 | Cunningham, Jr. |
| 7,701,199 B2 | 4/2010 | Makinson et al. |
| 7,702,594 B2 | 4/2010 | Scoggins et al. |
| 7,729,810 B2 | 6/2010 | Bell et al. |
| 7,729,852 B2 | 6/2010 | Hoiness et al. |
| 7,742,430 B2 | 6/2010 | Scoggins et al. |
| 7,746,054 B2 | 6/2010 | Shuey |
| 7,747,400 B2 | 6/2010 | Voisine |
| 7,747,534 B2 | 6/2010 | Villicana et al. |
| 7,756,030 B2 | 7/2010 | Clave et al. |
| 7,756,078 B2 | 7/2010 | Wyk et al. |
| 7,756,651 B2 | 7/2010 | Holdsclaw |
| 7,761,249 B2 | 7/2010 | Ramirez |
| 7,764,714 B2 | 7/2010 | Monier et al. |
| 7,860,672 B2 | 12/2010 | Richeson et al. |
| 8,301,314 B2 * | 10/2012 | Deaver, Sr. ............. H02J 3/00 700/291 |
| 8,437,883 B2 | 5/2013 | Powell et al. |
| 8,577,510 B2 | 11/2013 | Powell et al. |
| 8,583,520 B1 | 11/2013 | Forbes, Jr. |
| 2002/0109607 A1 | 8/2002 | Cumeralto et al. |
| 2002/0128748 A1 | 9/2002 | Krakovich et al. |
| 2002/0158774 A1 | 10/2002 | Johnson et al. |
| 2003/0001754 A1 | 1/2003 | Johnson et al. |
| 2003/0122686 A1 | 7/2003 | Ehrke et al. |
| 2003/0187550 A1 | 10/2003 | Wilson et al. |
| 2004/0061625 A1 | 4/2004 | Ehrke et al. |
| 2004/0066310 A1 | 4/2004 | Ehrke et al. |
| 2004/0070517 A1 | 4/2004 | Ehrke et al. |
| 2004/0119458 A1 | 6/2004 | Heuell et al. |
| 2004/0150575 A1 | 8/2004 | Lizalek et al. |
| 2004/0192415 A1 | 9/2004 | Luglio et al. |
| 2004/0218616 A1 | 11/2004 | Ardalan et al. |
| 2004/0222783 A1 | 11/2004 | Loy |
| 2005/0024235 A1 | 2/2005 | Shuey et al. |
| 2005/0090995 A1 | 4/2005 | Sonderegger |
| 2005/0110480 A1 | 5/2005 | Martin et al. |
| 2005/0119841 A1 | 6/2005 | Martin |
| 2005/0119930 A1 | 6/2005 | Simon |
| 2005/0212689 A1 | 9/2005 | Randall |
| 2005/0218873 A1 | 10/2005 | Shuey et al. |
| 2005/0237047 A1 | 10/2005 | Voisine |
| 2005/0240314 A1 | 10/2005 | Martinez |
| 2005/0251401 A1 | 11/2005 | Shuey |
| 2005/0251403 A1 | 11/2005 | Shuey |
| 2005/0270015 A1 | 12/2005 | Hemminger et al. |
| 2005/0278440 A1 | 12/2005 | Scoggins |
| 2006/0001415 A1 | 1/2006 | Fridholm et al. |
| 2006/0012935 A1 | 1/2006 | Murphy |
| 2006/0038548 A1 | 2/2006 | Shuey |
| 2006/0043961 A1 | 3/2006 | Loy |
| 2006/0044157 A1 | 3/2006 | Peters et al. |
| 2006/0044851 A1 | 3/2006 | Lancaster et al. |
| 2006/0055610 A1 | 3/2006 | Borisov et al. |
| 2006/0056493 A1 | 3/2006 | Cornwall et al. |
| 2006/0071810 A1 | 4/2006 | Scoggins et al. |
| 2006/0071812 A1 | 4/2006 | Mason, Jr. et al. |
| 2006/0074556 A1 | 4/2006 | Hoiness et al. |
| 2006/0074601 A1 | 4/2006 | Hoiness et al. |
| 2006/0085147 A1 | 4/2006 | Cornwall et al. |
| 2006/0114121 A1 | 6/2006 | Cumeralto et al. |
| 2006/0126255 A1 | 6/2006 | Slater et al. |
| 2006/0145685 A1 | 7/2006 | Ramirez |
| 2006/0145890 A1 | 7/2006 | Junker et al. |
| 2006/0158177 A1 | 7/2006 | Ramirez |
| 2006/0158348 A1 | 7/2006 | Ramirez |
| 2006/0168804 A1 | 8/2006 | Loy et al. |
| 2006/0202858 A1 | 9/2006 | Holle et al. |
| 2006/0206433 A1 | 9/2006 | Scoggins |
| 2006/0217936 A1 | 9/2006 | Mason et al. |
| 2006/0224335 A1 | 10/2006 | Borleske et al. |
| 2006/0232433 A1 | 10/2006 | Holle et al. |
| 2006/0261973 A1 | 11/2006 | Junker et al. |
| 2007/0013549 A1 | 1/2007 | Schleich et al. |
| 2007/0063868 A1 | 3/2007 | Borleske |
| 2007/0091548 A1 | 4/2007 | Voisine |
| 2007/0096769 A1 | 5/2007 | Shuey |
| 2007/0115022 A1 | 5/2007 | Hemminger et al. |
| 2007/0124109 A1 | 5/2007 | Timko et al. |
| 2007/0124262 A1 | 5/2007 | Uy et al. |

(56) References Cited

U.S. PATENT DOCUMENTS

| | | |
|---|---|---|
| 2007/0147268 A1 | 6/2007 | Kelley et al. |
| 2007/0177319 A1 | 8/2007 | Hirst |
| 2007/0200729 A1 | 8/2007 | Borleske et al. |
| 2007/0205915 A1 | 9/2007 | Shuey et al. |
| 2007/0213880 A1 | 9/2007 | Ehlers |
| 2007/0222421 A1 | 9/2007 | Labuschagne |
| 2007/0229305 A1 | 10/2007 | Bonicatto et al. |
| 2007/0236362 A1 | 10/2007 | Brian et al. |
| 2007/0257813 A1 | 11/2007 | Vaswani et al. |
| 2007/0262768 A1 | 11/2007 | Holdsclaw |
| 2007/0271006 A1 | 11/2007 | Golden et al. |
| 2008/0001779 A1 | 1/2008 | Cahill-O'Brien et al. |
| 2008/0007247 A1 | 1/2008 | Gervais et al. |
| 2008/0007426 A1 | 1/2008 | Morand |
| 2008/0010212 A1 | 1/2008 | Moore et al. |
| 2008/0012550 A1 | 1/2008 | Shuey |
| 2008/0018492 A1 | 1/2008 | Ehrke et al. |
| 2008/0024115 A1 | 1/2008 | Makinson et al. |
| 2008/0062055 A1 | 3/2008 | Cunningham |
| 2008/0068004 A1 | 3/2008 | Briese et al. |
| 2008/0068005 A1 | 3/2008 | Briese et al. |
| 2008/0068006 A1 | 3/2008 | Briese et al. |
| 2008/0079741 A1 | 4/2008 | Martin et al. |
| 2008/0088475 A1 | 4/2008 | Martin |
| 2008/0097707 A1 | 4/2008 | Voisine |
| 2008/0111526 A1 | 5/2008 | Shuey |
| 2008/0116906 A1 | 5/2008 | Martin et al. |
| 2008/0129420 A1 | 6/2008 | Borisov et al. |
| 2008/0129537 A1 | 6/2008 | Osterloh et al. |
| 2008/0143491 A1 | 6/2008 | Deaver |
| 2008/0144548 A1 | 6/2008 | Shuey et al. |
| 2008/0180274 A1 | 7/2008 | Cumeralto et al. |
| 2008/0204272 A1 | 8/2008 | Ehrke et al. |
| 2008/0204953 A1 | 8/2008 | Shuey |
| 2008/0218164 A1 | 9/2008 | Sanderford |
| 2008/0219210 A1 | 9/2008 | Shuey et al. |
| 2008/0224891 A1 | 9/2008 | Ehrke et al. |
| 2008/0238714 A1 | 10/2008 | Ehrke et al. |
| 2008/0238716 A1 | 10/2008 | Ehrke et al. |
| 2008/0266133 A1 | 10/2008 | Martin |
| 2009/0003214 A1 | 1/2009 | Vaswani et al. |
| 2009/0003232 A1 | 1/2009 | Vaswani et al. |
| 2009/0003243 A1 | 1/2009 | Vaswani et al. |
| 2009/0003356 A1 | 1/2009 | Vaswani et al. |
| 2009/0015234 A1 | 1/2009 | Voisine et al. |
| 2009/0062970 A1 | 3/2009 | Forbes, Jr. et al. |
| 2009/0096211 A1 | 4/2009 | Stiesdal |
| 2009/0134996 A1 | 5/2009 | White, II et al. |
| 2009/0146839 A1 | 6/2009 | Reddy et al. |
| 2009/0153356 A1 | 6/2009 | Holt |
| 2009/0167558 A1 | 7/2009 | Borleske |
| 2009/0187284 A1 | 7/2009 | Kreiss et al. |
| 2009/0224940 A1 | 9/2009 | Cornwall |
| 2009/0245270 A1 | 10/2009 | Van Greunen et al. |
| 2009/0256364 A1 | 10/2009 | Gadau et al. |
| 2009/0262642 A1 | 10/2009 | Van Greunen et al. |
| 2009/0265042 A1 | 10/2009 | Mollenkopf |
| 2009/0276170 A1 | 11/2009 | Bickel |
| 2009/0278708 A1 | 11/2009 | Kelley |
| 2009/0281673 A1 | 11/2009 | Taft |
| 2009/0281679 A1 | 11/2009 | Taft et al. |
| 2009/0284251 A1 | 11/2009 | Makinson et al. |
| 2009/0287428 A1 | 11/2009 | Holdsclaw |
| 2009/0294260 A1 | 12/2009 | Makinson et al. |
| 2009/0295371 A1 | 12/2009 | Pontin et al. |
| 2009/0296431 A1 | 12/2009 | Borisov |
| 2009/0299660 A1 | 12/2009 | Winter |
| 2009/0299884 A1 | 12/2009 | Chandra |
| 2009/0300191 A1 | 12/2009 | Pace et al. |
| 2009/0309749 A1 | 12/2009 | Gilbert et al. |
| 2009/0309756 A1 | 12/2009 | Mason |
| 2009/0310511 A1 | 12/2009 | Vaswani et al. |
| 2009/0312881 A1 | 12/2009 | Venturini et al. |
| 2009/0319093 A1 | 12/2009 | Joos et al. |
| 2010/0007521 A1 | 1/2010 | Cornwall |
| 2010/0007522 A1 | 1/2010 | Morris |
| 2010/0010700 A1 | 1/2010 | Hoiness et al. |
| 2010/0013632 A1 | 1/2010 | Salewske et al. |
| 2010/0026517 A1 | 2/2010 | Cumeralto et al. |
| 2010/0036624 A1 | 2/2010 | Martin et al. |
| 2010/0036625 A1 | 2/2010 | Martin et al. |
| 2010/0040042 A1 | 2/2010 | Van Greunen et al. |
| 2010/0045479 A1 | 2/2010 | Schamber et al. |
| 2010/0060259 A1 | 3/2010 | Vaswani et al. |
| 2010/0061350 A1 | 3/2010 | Flammer, III |
| 2010/0073193 A1 | 3/2010 | Flammer, III |
| 2010/0074176 A1 | 3/2010 | Flammer, III et al. |
| 2010/0074304 A1 | 3/2010 | Flammer, III |
| 2010/0094479 A1 | 4/2010 | Keefe |
| 2010/0103940 A1 | 4/2010 | Van Greunen et al. |
| 2010/0109650 A1 | 5/2010 | Briese et al. |
| 2010/0110617 A1 | 5/2010 | Savage et al. |
| 2010/0117856 A1 | 5/2010 | Sonderegger |
| 2010/0128066 A1 | 5/2010 | Murata et al. |
| 2010/0134089 A1 | 6/2010 | Uram et al. |
| 2010/0150059 A1 | 6/2010 | Hughes et al. |
| 2010/0157838 A1 | 6/2010 | Vaswani et al. |
| 2010/0188254 A1 | 7/2010 | Johnson et al. |
| 2010/0188255 A1 | 7/2010 | Cornwall |
| 2010/0188256 A1 | 7/2010 | Cornwall et al. |
| 2010/0188257 A1 | 7/2010 | Johnson |
| 2010/0188258 A1 | 7/2010 | Cornwall et al. |
| 2010/0188259 A1 | 7/2010 | Johnson et al. |
| 2010/0188260 A1 | 7/2010 | Cornwall et al. |
| 2010/0188263 A1 | 7/2010 | Cornwall et al. |
| 2010/0188938 A1 | 7/2010 | Johnson et al. |
| 2010/0192001 A1 | 7/2010 | Cornwall et al. |
| 2010/0217550 A1* | 8/2010 | Crabtree ............... H02J 3/005 702/62 |
| 2010/0286840 A1 | 11/2010 | Powell et al. |
| 2011/0025130 A1 | 2/2011 | Hadar et al. |
| 2012/0041696 A1 | 2/2012 | Sanderford, Jr. et al. |
| 2012/0053751 A1* | 3/2012 | Borresen et al. ............ 700/297 |
| 2012/0136638 A1 | 5/2012 | Deschamps et al. |
| 2012/0221265 A1* | 8/2012 | Arya et al. .................... 702/61 |
| 2012/0249278 A1 | 10/2012 | Krok et al. |
| 2013/0030591 A1 | 1/2013 | Powell et al. |
| 2014/0277788 A1 | 9/2014 | Forbes, Jr. |

FOREIGN PATENT DOCUMENTS

| | | |
|---|---|---|
| JP | S57-148533 A | 9/1982 |
| JP | 63-299722 A | 12/1988 |
| JP | H10-164756 A | 6/1998 |
| JP | 2002-247780 A | 8/2002 |
| JP | 2004-096906 A | 3/2004 |
| JP | 2006-208047 A | 8/2006 |
| JP | 2009-33811 A | 2/2009 |
| JP | 2009-65817 A | 3/2009 |
| RU | 2066084 | 8/1996 |
| RU | 2200364 | 3/2003 |
| SU | 14733008 | 4/1989 |
| WO | WO 98/26489 | 6/1998 |
| WO | WO 2008/144860 A1 | 12/2008 |

OTHER PUBLICATIONS

Willis, H. L., "Power Distribution Planning Reference Book." Second Edition, Revised and Expanded, Chapter 10, pp. 356-363 and 387, 2004.

Wilson, T. L., "Measurement and Verification of Distribution Voltage Optimization Results for the IEEE Power & Energy Society", 2010, pp. 1-9.

International Search Report and Written Opinion of the International searching Authority mailed Dec. 20, 2010 on related PCT Appln. PCT/US2010/033751.

International Search Report and Written Opinion of the International searching Authority mailed Jul. 24, 2014 on related PCT Appln. PCT/US2014/027332.

International Search Report and Written Opinion of the International searching Authority mailed Jul. 29, 2014 on related PCT Appln. PCT/US2014/027299.

(56) References Cited

OTHER PUBLICATIONS

International Search Report and Written Opinion of the International searching Authority mailed Aug. 7, 2014 on related PCT Appln. PCT/US2014/027310.
International Search Report and Written Opinion of the International searching Authority mailed Sep. 5, 2014 on related PCT Appln. PCT/US2014/27361.
Williams, B. R., "Distribution Capacitor Automation Provides Integrated Control of Customer Voltage Levels and Distribution Reactive Power Flow," Southern California Edison Company, Power Industry Computer Application Conference, 1995, Conference Proceedings, pp. 215-220.
Fletcher, R. H. et al., "Integrating Engineering and Economic Analysis for Conservation Voltage Reduction," Power Engineering Society Summer Meeting, 2002 IEEE (vol. 2), pp. 725-730.
Kennedy, P. E. et al., "Conservation Voltage Reduction (CVR) at Snohmish County PUD," Transactions on Power Systems, vol. 6, No. 3, Aug. 1991, pp. 986-998.
American National Standard for Electric Power Systems and Equipment Voltage Ratings (60 Hertz); National Electrical Manufactures Association, Approved Dec. 6, 2006, American National Standards Institute, Inc., pp. 1-23.
Bryon Flynn, "Key Smart Grid Applications", Protection & Control Journal, Jul. 2009, pp. 29-34.
Carl LaPlace, et al. Realizing the Smart Grid of the Future through AMI technology, 14 pages, Jun. 1, 2009.
International Search Report and Written Opinion of the International Searching Authority mailed Sep. 24, 2015 on related PCT Appln. PCT/US2014/027299.

\* cited by examiner

QC_Missing_Records_Report

| Transformer | Type | Date |
|---|---|---|
| Prescott T2 | Interval_Data | 3/11/2012 2:00:00 AM |
| Prescott T2 | CVR_Status | 3/11/2012 2:00:00 AM |

624

QC_Interval_Data_Mapped

| Transformer | DATE | TIME | MWATT | VOLT | QC_Record_Flag |
|---|---|---|---|---|---|
| Prescott T2 | 1/10/2012 | 13:00 | 3.7843 | 122.181 | Repeated Values |
| Prescott T2 | 1/10/2012 | 14:00 | 3.7283 | 122.181 | Repeated Values |
| Prescott T2 | 1/10/2012 | 15:00 | 3.6704 | 122.181 | Repeated Values |
| Prescott T2 | 1/10/2012 | 16:00 | 3.7732 | 122.181 | Repeated Values |
| Prescott T2 | 1/27/2012 | 1:00 | 2.9396 | 121.497 | Repeated Values |
| Prescott T2 | 1/27/2012 | 2:00 | 2.7281 | 121.497 | Repeated Values |
| Prescott T2 | 1/27/2012 | 3:00 | 2.65 | 121.497 | Repeated Values |
| Prescott T2 | 1/27/2012 | 4:00 | 2.6315 | 121.497 | Repeated Values |
| Prescott T2 | 1/28/2012 | 12:00 | 4.0898 | 122.331 | Repeated Values |
| Prescott T2 | 1/28/2012 | 13:00 | 3.925 | 122.331 | Repeated Values |
| Prescott T2 | 1/28/2012 | 14:00 | 3.819 | 122.331 | Repeated Values |
| Prescott T2 | 1/28/2012 | 15:00 | 3.7109 | 122.331 | Repeated Values |
| Prescott T2 | 1/30/2012 | 13:00 | 3.679 | 122.331 | Repeated Values |
| Prescott T2 | 1/30/2012 | 14:00 | 3.6432 | 122.331 | Repeated Values |
| Prescott T2 | 1/30/2012 | 15:00 | 3.7112 | 122.331 | Repeated Values |
| Prescott T2 | 1/30/2012 | 16:00 | 3.856 | 122.331 | Repeated Values |
| Prescott T2 | 1/31/2012 | 13:00 | 3.8381 | 122.331 | Repeated Values |
| Prescott T2 | 1/31/2012 | 14:00 | 3.7878 | 122.331 | Repeated Values |
| Prescott T2 | 1/31/2012 | 15:00 | 3.6267 | 122.331 | Repeated Values |
| Prescott T2 | 1/31/2012 | 16:00 | 3.7656 | 122.331 | Repeated Values |
| Prescott T2 | 2/19/2012 | 2:00 | 2.873 | 121.569 | Repeated Values |

621

DAYLIGHT SAVINGS

| Transformer | DATE | TIME | MWATT | VOLT | QC_Record_Flag |
|---|---|---|---|---|---|
| Prescott T2 | 7/26/2012 | 10:00 | 0 | 120.604 | MWATT |
| Prescott T2 | 7/26/2012 | 11:00 | 0 | 120.748 | MWATT |
| Prescott T2 | 7/26/2012 | 12:00 | 0 | 121.354 | MWATT |
| Prescott T2 | 7/26/2012 | 13:00 | 0 | 121.597 | MWATT |
| Prescott T2 | 7/26/2012 | 14:00 | 0 | 121.002 | MWATT |
| Prescott T2 | 8/2/2012 | 7:00 | 1.7145 | 96.967 | VOLT |
| Prescott T2 | 8/2/2012 | 8:00 | 0.0211 | 0.152 | VOLT |
| Prescott T2 | 8/2/2012 | 9:00 | 0.0211 | 8.488 | VOLT |

| Paired_Group_Description | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| WINTER 1 |  | 1 | 1 | 1 | 1 | 1 | 1 | 1 |  |  |  |  |  |  |  |  |  |  |  |  |  |  |  |  |
| WINTER 2 | 2 |  |  |  |  |  |  |  | 2 | 2 |  |  |  |  |  |  |  |  |  |  |  |  |  |  |
| WINTER 3 |  |  |  |  |  |  |  |  |  |  | 3 |  | 3 | 3 | 3 | 3 | 3 |  |  |  |  |  |  | 3 |
| WINTER 4 |  |  |  |  |  |  |  |  |  |  |  |  |  |  |  |  |  | 4 | 4 | 4 | 4 | 4 | 4 |  |
| SPRING 5 | 5 | 5 | 5 | 5 | 5 | 5 | 5 | 5 | 5 |  |  |  |  |  |  |  |  |  |  |  |  |  |  |  |
| SPRING 6 |  |  |  |  |  |  |  |  |  |  |  |  |  |  |  |  | 6 | 6 | 6 |  |  |  |  | 6 |
| SPRING 7 |  |  |  |  |  |  |  |  |  |  |  |  |  |  |  |  |  |  |  | 7 | 7 | 7 | 7 |  |
| SUMMER 8 | 8 | 8 | 8 | 8 | 8 | 8 | 8 | 8 | 8 | 8 | 8 |  | 8 | 8 | 8 | 8 | 8 |  |  |  |  |  |  |  |
| SUMMER 9 |  |  |  |  |  |  |  |  |  |  |  |  |  |  |  |  |  | 9 | 9 | 9 | 9 |  |  | 9 |
| SUMMER 10 |  |  |  |  |  |  |  |  |  |  |  |  |  |  |  |  |  |  |  |  |  | 10 | 10 |  |
| FALL 11 | 11 | 11 | 11 | 11 | 11 | 11 | 11 | 11 | 11 | 11 |  |  |  |  |  |  |  |  |  |  |  |  |  |  |
| FALL 12 |  |  |  |  |  |  |  |  |  |  | 12 | 12 | 12 | 12 | 12 | 12 | 12 |  |  |  |  |  |  | 12 |
| FALL 13 |  |  |  |  |  |  |  |  |  |  |  |  |  |  |  |  |  | 13 | 13 | 13 | 13 | 13 | 13 |  |

HOUR OF THE DAY

FIG. 10

Results

CVR Factor

| | | |
|---|---|---|
| Mean CVR Factor: | 0.7904 | - Within valid range of 0.0 to 1.2, industry average is 0.8. |
| Standard Deviation: | 1.6032 | |
| Degree Threshold: | 1.0 | |
| Humidity Threshold: | 1.0 | |

[Details]

Results

Savings

| | |
|---|---|
| Lifetime Usage (MWh): | 458,312 |
| Lifetime Savings (MWh): | 10,069 |
| Lifetime Savings: | 2.20% |
| 30 Day Usage (MWh): | 14,585 |
| 30 Day Savings (MWh): | 488 |
| 30 Day Savings: | 3.34% |

FIG. 15

ELECTRIC POWER SYSTEM CONTROL WITH MEASUREMENT OF ENERGY DEMAND AND ENERGY EFFICIENCY USING T-DISTRIBUTIONS

This application claims priority under 35 U.S.C. §119(e) to U.S. provisional patent application 61/789,085 filed on Mar. 15, 2013, which is hereby incorporated by reference in its entirety herein.

BACKGROUND

The present disclosure relates to a method, an apparatus, a system and a computer program for controlling an electric power system, including measuring the effects of optimizing voltage, conserving energy, and reducing demand using t distributions. More particularly, the disclosure relates to a novel implementation of electrical demand and energy efficiency improvement measurement using a paired samples t-test to compare the population demand and energy usage over a specific time period. This method enables the direct statistical measurement of energy and demand changes between two time periods for an energy use population. This comparison can be used as a basis to accurately quantify energy efficiency and demand reduction values for savings resulting from implementation of a modification to the electric power system.

Electricity is commonly generated at a power station by electromechanical generators, which are typically driven by heat engines fueled by chemical combustion or nuclear fission, or driven by kinetic energy flowing from water or wind. The electricity is generally supplied to end users through transmission grids as an alternating current signal. The transmission grids may include a network of power stations, transmission circuits, substations, and the like.

The generated electricity is typically stepped-up in voltage using, for example, generating step-up transformers, before supplying the electricity to a transmission system. Stepping up the voltage improves transmission efficiency by reducing the electrical current flowing in the transmission system conductors, while keeping the power transmitted nearly equal to the power input. The stepped-up voltage electricity is then transmitted through the transmission system to a distribution system, which distributes the electricity to end users. The distribution system may include a network that carries electricity from the transmission system and delivering it to end users. Typically, the network may include medium-voltage (for example, less than 69 kV) power lines, electrical substations, transformers, low-voltage (for example, less than 1 kV) distribution wiring, electric meters, and the like.

The following, the entirety of which is herein incorporated by reference, describe subject matter related to power generation or distribution: Power Distribution Planning Reference Book, Second Edition, H. Lee Willis, 2004; Estimating Methodology for a Large Regional Application of Conservation Voltage Reduction, J. G. De Steese, S. B. Merrick, B. W. Kennedy, IEEE Transactions on Power Systems, 1990; Implementation of Conservation Voltage Reduction at Commonwealth Edison, IEEE Transactions on Power Systems, D. Kirshner, 1990; Conservation Voltage Reduction at Northeast Utilities, D. M. Lauria, IEEE, 1987; Green Circuit Field Demonstrations, EPRI, Palo Alto, Calif., 2009, Report 1016520; Evaluation of Conservation Voltage Reduction (CVR) on a National Level, PNNL-19596, Prepared for the U.S. Department of Energy under Contract DE-AC05-76RL01830, Pacific Northwest National Lab, July 2010; Utility Distribution System Efficiency Initiative (DEI) Phase 1, Final Market Progress Evaluation Report, No 3, E08-192 (July 2008) E08-192; Simplified Voltage Optimization (VO) Measurement and Verification Protocol, Simplified VO M&V Protocol Version 1.0, May 4, 2010; MINITAB Handbook, Updated for Release 14, fifth edition, Barbara Ryan, Brian Joiner, Jonathan Cryer, Brooks/Cole-Thomson, 2005; Minitab Software, http://www.minitab.com/en-US/products/minitab/; Statistical Software provided by Minitab Corporation.

Further, U.S. patent application 61/176,398, filed on May 7, 2009 and US publication 2013/0030591 entitled VOLTAGE CONSERVATION USING ADVANCED METERING INFRASTRUCTURE AND SUBSTATION CENTRALIZED VOLTAGE CONTROL, the entirety of which is herein incorporated by reference, describe a voltage control and energy conservation system for an electric power transmission and distribution grid configured to supply electric power to a plurality of user locations.

SUMMARY

Various embodiments described herein provide a novel method, apparatus, system and computer program for controlling an electric power system, including implementation of voltage measurement using paired t statistical analysis applied to calculating a shift in average usage per customer from one time period to another time period for a given electrical use population where the pairing process is optimized using a novel technique to improve the accuracy of the statistical measurement.

According to an aspect of the disclosure, the energy validation process (EVP) measures the level of change in energy usage for the electrical energy delivery system (EEDS) that is made up of an energy supply system (ESS) that connects electrically to one or more energy usage systems (EUS). A modification is made to the operation of the EEDS or to an energy usage device (EUD) at some electrical point on an electrical energy delivery system (EEDS) made up of many energy usage devices randomly using energy at any given time during the measurement. The purpose of the energy validation process (EVP) is to measure the level of change in energy usage for the EEDS. The electrical energy supply to the electrical energy delivery system (EEDS) is measured in watts, kilowatts (kw), or Megawatts (MW) (a) at the supply point of the ESS and (b) at the energy user system (EUS) or meter point. This measurement records the average usage of energy (AUE) at each of the supply and meter points over set time periods such as one hour.

The test for the level of change in energy use is divided into two basic time periods: The first is the time period when the modification is not operating, i.e., in the "OFF" state. The second time period is when the modification is operating, i.e., in the "ON" state. Because electrical energy usage is not constant but varies with other independent variables such as weather and ambient conditions, weather and ambient variation as well as other independent variables must be eliminated from the comparison of the "OFF" state to the "ON" state. The intent is to leave only the one independent variable being measured in the comparison of average energy usage from the "OFF" to the "ON" condition.

To eliminate the effect of the ambient and/or weather conditions a pairing process is used to match energy periods with common ambient and/or weather conditions using a pairing process. As an example, temperature, heating degree, cooling degree and other weather conditions are recorded for each energy measurement over the set time periods. These periods are paired if the temperature, heating degree, cooling degree and other weather conditions match according to an optimization process for selecting the most accurate pairs.

To eliminate other independent variables not being measured that will cause variation in the measurement, an EEDS of a near identical energy supply system and near identical energy usage system that is located in the same ambient and/or weather system is used. To eliminate the other independent variables, the changes in energy in the EEDS of a near identical energy supply system are subtracted from the changes measured by the EEDS under test. This method corrects the test circuit for the effects of the other remaining independent variables.

The measurement process consists of first pairing intervals of average energy usage data from the "OFF" state to the "ON" state. The first step is to eliminate significant outliers that are easily identified as not being associated with the independent variable. As an example, if the expected (based on experience or otherwise) load shift resulting from a modification is a maximum of 2 kw and the data shows a population member with an load shift of 10 MW, this element can be excluded. Exclusion has to be done consistently across the population not to destroy the population normality.

The second step is to set the limits of the pairing process. The limits may be set based, at least in part, on the accuracy desired. The accuracy also depends on the number of data points used. As an example, for temperature difference, a limit might be chosen to be one degree Fahrenheit (F). With this choice of limits, a time period type is chosen over which data measurements are examined. Choice of the time period may depend on what EEDS operating environment conditions are relevant for a chosen analysis. For example, a 24-hour time period may be chosen to include the variation of the measured data over a full day. As another example, a four-hour time period in the evening may be chosen to include the variation of measured data over a peak evening electricity usage period.

During the time period, data is collected from a set of sensors in a portion of the EEDS with the modification in the "ON" state. During the same type time period (which may or may not run concurrently with time period for collection in the "ON" state), data is collected from a group of sensors that are potential pairs to the set from a portion of the EEDS with the modification in the "OFF" state. The pairs are reviewed to assure that the best match of temperature levels between the match is chosen. This process may be repeated for other variables. Once the best group of pairs is identified, a standard process of paired t is applied to determine the average change in energy usage from the "OFF" state to the "ON" state using a t distribution for the group of pairs identified. This process can determine, within a confidence level, the actual range of change in energy use from the "OFF" state to the "ON" state for this population. For this process, measurements can be made at the electrical energy delivery system (EEDS) meter point(s) or at the energy usage systems (EUS) meter point(s) or with the energy usage device (EUD) meter points or any combination of EEDS, EUS and EUD meter points.

The resulting change in energy usage may then be used to control the electric energy delivery system. For example, components of the EEDS may be modified, adjusted, added or deleted, including the addition of capacitor banks, modification of voltage regulators, changes to end-user equipment to modify customer efficiency, and other control actions.

According to a further aspect of the disclosure, the energy validation process (EVP) measures the level of change in energy usage for the electrical energy delivery system (EEDS) that is made up of an energy supply system (ESS) that connects electrically to one or more energy usage systems (EUS). This is similar to the aspect described above, however multiple modifications are made to EEDS operation or to energy usage devices (EUD) at electrical point(s) on an electrical energy delivery system (EEDS) made up of many energy usage devices randomly using energy at any given time during the measurement. The purpose of the energy validation process (EVP) is to measure the level of change in energy usage for the EEDS with combined modifications and with each of the individual modifications. The electrical energy supply to the electrical energy delivery system (EEDS) is measured in watts, kw, or MW (a) at the supply point of the ESS and (b) at the energy user system (EUS) or meter point. This measurement records the average usage of energy (AUE) at each of the supply and meter points over set time periods such as one hour.

The test for the level of change in energy use improvement is divided into two basic time periods: The first is the time period when the modification is not operating, i.e., in the "OFF" state. The second time period is when the modification is operating, i.e., in the "ON" state. Because electrical energy usage is not constant but varies with other independent variable such as weather and ambient conditions, weather and ambient variation as well as other independent variables must be eliminated from the comparison of the "OFF" state to the "ON" state. The intent is to leave only the independent variables being measured in the comparison of average energy usage from the "OFF" to the "ON" condition.

To eliminate the effect of the ambient and/or weather conditions a pairing process is used to match energy periods with common ambient and/or weather conditions using a pairing process. As an example temperature, heating degree, cooling degree and other weather conditions are recorded for each energy measurement over the set time periods. These periods are paired if the temperature, heating degree, cooling degree and other weather conditions match according to an optimization process for selecting the most accurate pairs.

To eliminate other independent variables not being measured that will cause variation in the measurement, an EEDS of a near identical energy supply system and near identical energy usage system that is located in the same ambient and/or weather system is used. To eliminate the other independent variables, the changes in energy in an EEDS of a near identical energy supply system are subtracted from the changes measured by the EEDS under test. This method corrects the test EEDS for the effects of the other remaining independent variables.

The measurement process consists of first pairing intervals of average energy usage data from the "OFF" state to the "ON" state. The first step is to eliminate significant outliers that are easily identified as not being associated with the independent variable. As an example, if the expected load shift for a modification is a maximum of 2 kw and the data shows a population member with a load shift of 10 MW, this element can be excluded. Exclusion has to be done consistently across the population not to destroy the population normality.

The second step is to set the limits of the pairing process. As an example for temperature difference a limit might be chosen to be one degree F. With this choice of limits, similar to the preceding described aspect, a time period is chosen over which data measurements shall be or have been taken from a set of sensors with the modification in the "ON" state, and from a group of sensors that are potential pairs to the set, with the modification in the "OFF" state. The pairs are reviewed to assure that the best match of temperature levels between the match is chosen. This is repeated for other variables and once the best group of pairs is identified, a standard process of paired t is applied to determine the average change in energy usage from the "OFF" state to the "ON" state using a t distribution for the group of pairs identified. This process can determine within a confidence interval the actual range of change in energy use from the "OFF" state to the "ON" state for this population. For this process, measurements can be made at the electrical energy delivery system (EEDS) meter point(s) or at the energy usage systems (EUS) meter point(s) or with the energy usage device (EUD) meter points or any combination of EEDS, EUS and EUD meter points.

The resulting change in energy usage may then be used to control the electric energy delivery system. For example, components of the EEDS may be modified, adjusted, added or deleted, including the addition of capacitor banks, modification of voltage regulators, changes to end-user equipment to modify customer efficiency, and other control actions.

The energy validation process (EVP) may further contain a second independent variable such as humidity that affects the energy usage. The EVP is then used to provide a second pairing variable that is secondary to the first pairing variable. The process pairs the first variable as close as possible with the population "OFF" to "ON" values for the chosen energy intervals. The matching second variable is already matched to the first variable for the interval. A weighed scoring of the pairs is implemented based on the relative slopes of the linear relationship between the energy and the respective independent variable. This produces an optimized selection of pairs to most closely match the two population points. This linear optimal matching provides the best pairing of the data for t-distribution evaluation. This method allows multiple values to be optimally paired for calculating average energy changes using the t-distribution.

The energy validation process (EVP) may further contain an electrical energy delivery system (EEDS) that is made up of an energy supply system (ESS) that connects electrically to one or more energy usage systems (EUS) that has three phases of power. The EVP will then perform all power and independent variable calculations by phase values in all combinations of EEDS, ESS, EUS, and EUDs to calculate the energy changes due to modifications in the energy systems. Thus calculations may be performed separately using data for sensed properties specific to each of one of the three phases. In this way, the effects of the modifications to the BEDS for one or more phases may be compared to its effects for the other phase(s).

The energy validation process (EVP) may further contain a second independent variable such as voltage where the ratio of the average change in voltage to average change in energy is being calculated or the conservation voltage reduction factor (CVRF). This factor measures the capacity of the EEDS, EUS and EUD's to change energy usage in response to the independent variable of voltage. The EVP calculates the CVRF first by pairing two energy states from the "OFF" state to the "ON" state as already described. Second the ratio of the percent change in energy divided by the percent change in voltage for the sample is calculated between the two states for each sample in the population. Optimal pairing matches the closest samples for evaluation using a t-distribution to determine the confidence interval for the average value of the CVRF.

The energy validation process (EVP) may further contain multiple independent variables such as voltage and circuit unbalance where the ratio of the average change in voltage and circuit unbalance to average change in energy is being calculated or the energy reduction factor (ERF). This factor measures the capacity of the EEDS, EUS and EUD's to change energy usage in response to multiple independent variables. The EVP calculates the ERF first by pairing two energy states from the "OFF" state to the "ON" state as already described. Second the ratio of the change in energy divided by the change in combined % change of the multiple variables for the sample is calculated between the two states for each sample in the population. Optimal pairing matches the closest samples for evaluation using a t-distribution to determine the confidence interval for the average value of the ERF.

The energy validation process (EVP) may further contain an electrical energy delivery system (EEDS) that is made up of an energy supply system (ESS) that connects electrically to one or more energy usage systems (EUS). The EVP evaluation time period (or interval) can be developed in multiple levels. This is useful to categorize the connected EUD's using a linear regression technique. As a starting point the interval could use the standard interval of 24 hours to capture the effects of load cycling over multiple hours. But in some cases not all loads will be connected during the full 24 hours and the energy measurements may not be consistent over the total period. To address this, for example, evaluations are separated into seasons to represent the different loads, such as air conditioning and heating between the summer and winter seasons respectively. In the fall and spring these loads may not exist under mild weather conditions, so they are evaluated separately as well. In addition each season is evaluated by using linear regression to represent the multiple variables that affect the loads for each hour, such as heating degree level, cooling degree level, day type (weekend, weekday or holiday), humidity, growth in load, and others. The hours are then grouped by the regression factor ranges to match the general characteristics of the load. This regression results in dividing each season into hour ranges for each 24 hour period that can be independently compared to determine their separate characteristics of energy performance in the population. The EVP will then perform all power and independent variable calculations by phase values, by season, by hourly ranges in all combinations of EEDS, ESS, EUS, and EUDs to calculate the energy changes due to modifications in the energy systems.

Additional features, advantages, and embodiments of the disclosure may be set forth or apparent from consideration of the detailed description and drawings. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 5 shows an example of general outlier analysis to determine population measurements that are outside of normal operation, according to principles of the disclosure;

FIG. 10 shows an example of the results of breaking the load data into groups by season and by hourly groups with similar characteristics, according to the principles of the disclosure;

FIG. 15 shows an example of a summary chart for the data shown in previous Figures on CVR factor and Energy savings per customer, according to principles of the disclosure.

Figure 1:
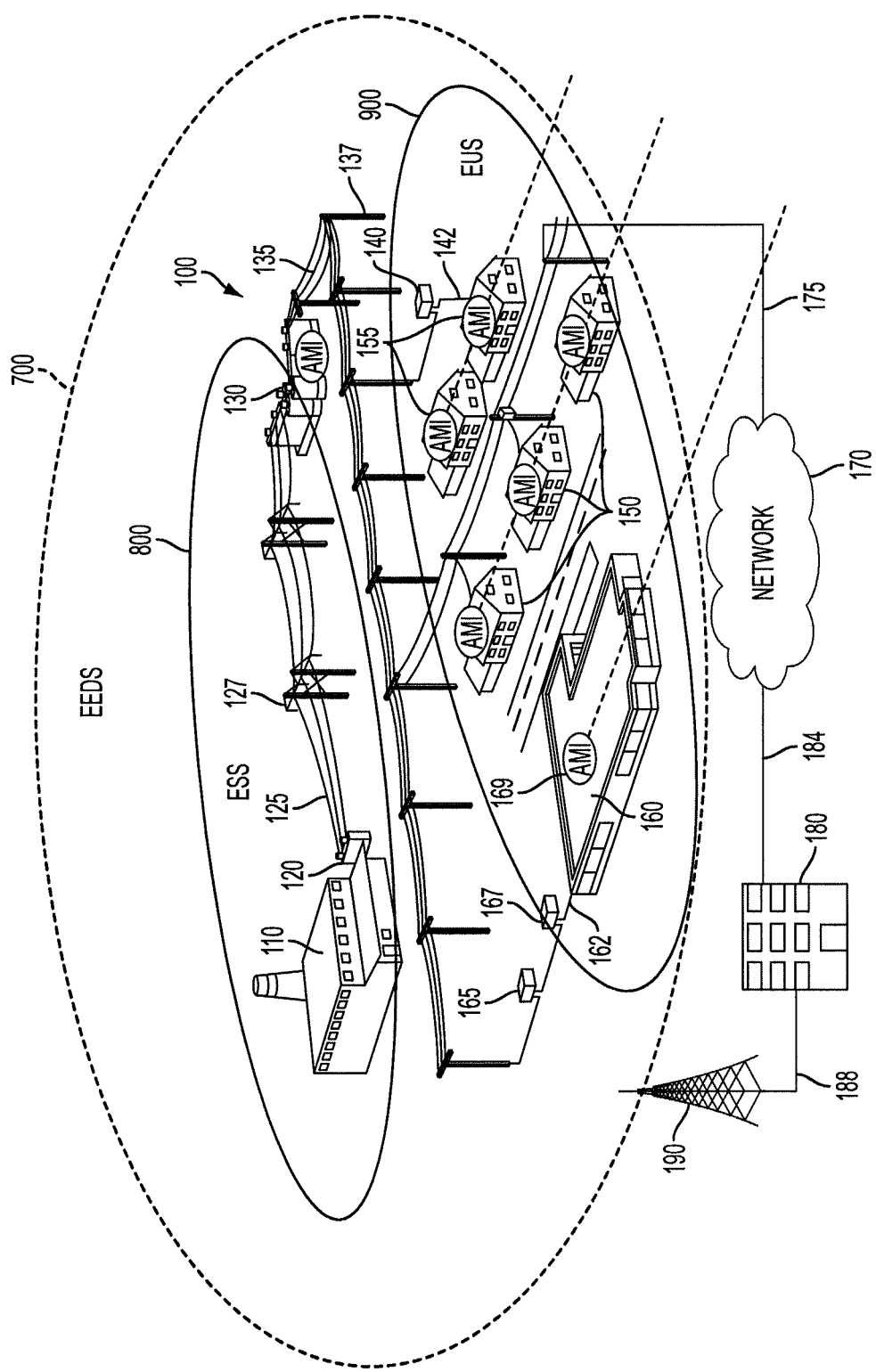
FIG. 1 shows an example of an EEDS made up of an electricity generation and distribution system connected to customer loads, according to principles of the disclosure.

The present disclosure is further described in the detailed description that follows.

DETAILED DESCRIPTION OF THE DISCLOSURE

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

A "computer", as used in this disclosure, means any machine, device, circuit, component, or module, or any system of machines, devices, circuits, components, modules, or the like, which are capable of manipulating data according to one or more instructions, such as, for example, without limitation, a processor, a microprocessor, a central processing unit, a general purpose computer, a super computer, a personal computer, a laptop computer, a palmtop computer, a notebook computer, a desktop computer, a workstation computer, a server, or the like, or an array of processors, microprocessors, central processing units, general purpose computers, super computers, personal computers, laptop computers, palmtop computers, notebook computers, desktop computers, workstation computers, servers, or the like.

A "server", as used in this disclosure, means any combination of software and/or hardware, including at least one application and/or at least one computer to perform services for connected clients as part of a client-server architecture. The at least one server application may include, but is not limited to, for example, an application program that can accept connections to service requests from clients by sending back responses to the clients. The server may be configured to run the at least one application, often under heavy workloads, unattended, for extended periods of time with minimal human direction. The server may include a plurality of computers configured, with the at least one application being divided among the computers depending upon the workload. For example, under light loading, the at least one application can run on a single computer. However, under heavy loading, multiple computers may be required to run the at least one application. The server, or any if its computers, may also be used as a workstation.

A "database", as used in this disclosure, means any combination of software and/or hardware, including at least one application and/or at least one computer. The database may include a structured collection of records or data organized according to a database model, such as, for example, but not limited to at least one of a relational model, a hierarchical model, a network model or the like. The database may include a database management system application (DBMS) as is known in the art. At least one application may include, but is not limited to, for example, an application program that can accept connections to service requests from clients by sending back responses to the clients. The database may be configured to run the at least one application, often under heavy workloads, unattended, for extended periods of time with minimal human direction.

A "communication link", as used in this disclosure, means a wired and/or wireless medium that conveys data or information between at least two points. The wired or wireless medium may include, for example, a metallic conductor link, a radio frequency (RF) communication link, an Infrared (IR) communication link, an optical communication link, or the like, without limitation. The RF communication link may include, for example, WiFi, WiMAX, IEEE 802.11, DECT, 0G, 1G, 2G, 3G or 4G cellular standards, Bluetooth, and the like.

The terms "including", "comprising" and variations thereof, as used in this disclosure, mean "including, but not limited to", unless expressly specified otherwise.

The terms "a", "an", and "the", as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

A "computer-readable medium", as used in this disclosure, means any medium that participates in providing data (for example, instructions) which may be read by a computer. Such a medium may take many forms, including non-volatile media, volatile media, and transmission media. Non-volatile media may include, for example, optical or magnetic disks and other persistent memory. Volatile media may include dynamic random access memory (DRAM). Transmission media may include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

Various forms of computer readable media may be involved in carrying sequences of instructions to a computer. For example, sequences of instruction (i) may be delivered from a RAM to a processor, (ii) may be carried over a wireless transmission medium, and/or (iii) may be formatted according to numerous formats, standards or protocols, including, for example, WiFi, WiMAX, IEEE 802.11, DECT, 0G, 1G, 2G, 3G or 4G cellular standards, Bluetooth, or the like.

According to one non-limiting example of the disclosure, a voltage control and conservation (VCC) system 200 is provided (shown in FIG. 2) and the EVP is being used to monitor the change in EEDS energy from the VCC. The VCC, which includes three subsystems, including an energy delivery (ED) system 300, an energy control (EC) system 400 and an energy regulation (ER) system 500. The VCC system 200 is configured to monitor energy usage at the ED system 300 and determine one or more energy delivery parameters at the EC system (or voltage controller) 400. The EC system 400 may then provide the one or more energy delivery parameters $C_{ED}$ to the ER system 500 to adjust the energy delivered to a plurality of users for maximum energy conservation. The energy validation process (EVP) system 600 monitors through communications link 610 all metered energy flow and determines the change in energy resulting from a change in voltage control at the ER system. The EVP system 600 also reads weather data information through a communication link 620 from an appropriate weather station 640 to execute the EVP process 630.

The VCC system 200 is also configured to monitor via communication link 610 energy change data from EVP system 600 and determine one or more energy delivery parameters at the EC system (or voltage controller) 400. The EC system 400 may then provide the one or more energy delivery parameters $C_{ED}$ to the ER system 500 to adjust the energy delivered to a plurality of users for maximum energy conservation. Similarly, the EC system 400 may use the energy change data to control the electric energy delivery system 700 in other ways. For example, components of the EEDS 700 may be modified, adjusted, added or deleted, including the addition of capacitor banks, modification of voltage regulators, changes to end-user equipment to modify customer efficiency, and other control actions.

The VCC system 200 may be integrated into, for example, an existing load curtailment plan of an electrical power supply system. The electrical power supply system may include an emergency voltage reduction plan, which may be activated when one or more predetermined events are triggered. The predetermined events may include, for example, an emergency, an overheating of electrical conductors, when the electrical power output from the transformer exceeds, for example, 80% of its power rating, or the like. The VCC system 200 is configured to yield to the load curtailment plan when the one or more predetermined events are triggered, allowing the load curtailment plan to be executed to reduce the voltage of the electrical power supplied to the plurality of users.

FIG. 1 is similar to FIG. 1 of US publication 2013/0030591, with overlays that show an example of an EEDS 700 system, including an EUS system 900 and an ESS system 800 based on the electricity generation and distribution system 100, according to principles of the disclosure. The electricity generation and distribution system 100 includes an electrical power generating station 110, a generating step-up transformer 120, a substation 130, a plurality of step-down transformers 140, 165, 167, and users 150, 160. The electrical power generating station 110 generates electrical power that is supplied to the step-up transformer 120. The step-up transformer steps-up the voltage of the electrical power and supplies the stepped-up electrical power to an electrical transmission media 125. The ESS 800 includes the station 110, the step-up transformer 120, the substation 130, the step-down transformers 140, 165, 167, the ER 500 as described herein, and the electrical transmission media, including media 125, for transmitting the power from the station 110 to users 150, 160. The EUS 900 includes the ED 300 system as described herein, and a number of energy usage devices (EUD) 920 that may be consumers of power, or loads, including customer equipment and the like.

As seen in FIG. 1, the electrical transmission media may include wire conductors, which may be carried above ground by, for example, utility poles 127 and/or underground by, for example, shielded conductors (not shown). The electrical power is supplied from the step-up transformer 120 to the substation 130 as electrical power $E_{In}(t)$, where the electrical power $E_{In}$ in MegaWatts (MW) may vary as a function of time t. The substation 130 converts the received electrical power $E_{In}(t)$ to $E_{Supply}(t)$ and supplies the converted electrical power $E_{Supply}(t)$ to the plurality of users 150, 160. The substation 130 may adjustably transform the voltage component $V_{In}(t)$ of the received electrical power $E_{In}(t)$ by, for example, stepping-down the voltage before supplying the electrical power $E_{Supply}(t)$ to the users 150, 160. The electrical power $E_{Supply}(t)$ supplied from the substation 130 may be received by the step-down transformers 140, 165, 167 and supplied to the users 150, 160 through a transmission medium 142, 162, such as, for example, but not limited to, underground electrical conductors (and/or above ground electrical conductors).

Each of the users 150, 160 may include an Advanced Meter Infrastructure (AMI) 155, 169. The AMI 155, 169 may be coupled to a Regional Operations Center (ROC) 180. The ROC 180 may be coupled to the AMI 155, 169, by means of a plurality of communication links 175, 184, 188, a network 170 and/or a wireless communication system 190. The wireless communication system 190 may include, but is not limited to, for example, an RF transceiver, a satellite transceiver, and/or the like.

The network 170 may include, for example, at least one of the Internet, a local area network (LAN), a wide area network (WAN), a metropolitan area network (MAN), a personal area network (PAN), a campus area network, a corporate area network, the electrical transmission media 125, 135 and transformers 140, 165, 167, a global area network (GAN), a broadband area network (BAN), or the like, any of which may be configured to communicate data via a wireless and/or a wired communication medium. The network 170 may be configured to include a network topology such as, for example, a ring, a mesh, a line, a tree, a star, a bus, a full connection, or the like.

The AMI 155, 169 may include any one or more of the following: A smart meter; a network interface (for example, a WAN interface, or the like); firmware; software; hardware; and the like. The smart meter may be configured to determine any one or more of the following: kilo-Watt-hours (kWh) delivered; kWh received; kWh delivered plus kWh received; kWh delivered minus kWh received; interval data; demand data; voltage; current; phase; and the like. If the smart meter is a three phase meter, then the low phase voltage may be used in the average calculation, or the values for each phase may be used independently. If the meter is a single phase meter, then the single voltage component will be averaged.

The AMI 155, 169 may further include one or more collectors (shown in FIG. 2) configured to collect smart meter data from one or more smart meters tasked with, for example, measuring and reporting electric power delivery and consumption at one or more of the users 150, 160. Alternatively (or additionally), the one or more collectors may be located external to the users 150, 160, such as, for example, in a housing holding the step-down transformers 140, 165, 167. Each of the collectors may be configured to communicate with the ROC 180.

VCC System 200

Figure 2:
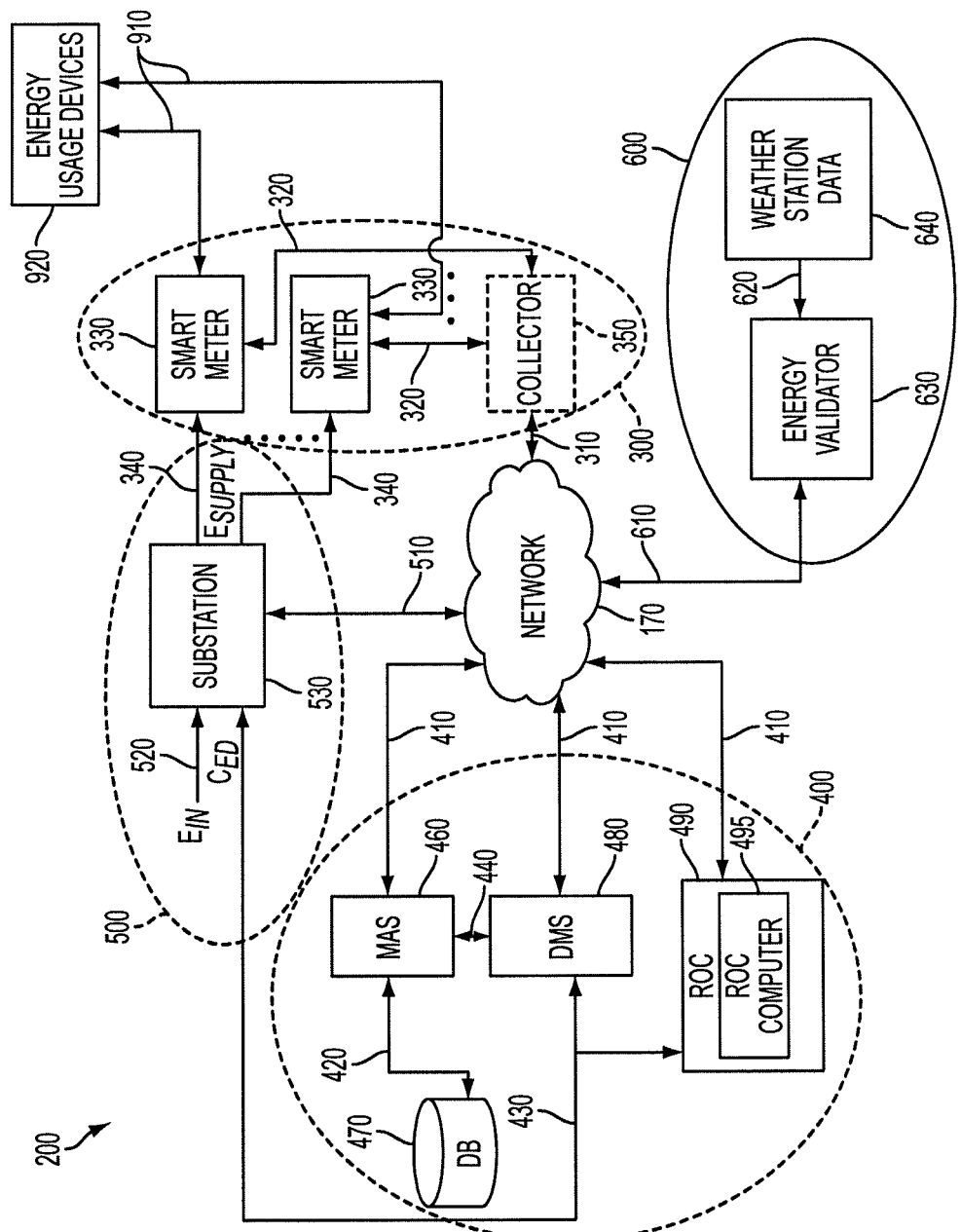
FIG. 2 shows an example of a voltage control and conservation (VCC) system being measured at the ESS meter point and the EUS made up of Advanced Metering Infrastructure (AMI) measuring Voltage and Energy, according to the principles of the disclosure.

FIG. 2 shows an example of the VCC system 200 with the EVP system 600 monitoring the change in energy resulting from the VCC controlling the EEDS in the more efficient lower 5% band of voltage, according to principles of the disclosure. The VCC system 200 includes the ED system 300, the EC system 400 and the ER system 500, each of which is shown as a broken-line ellipse. The VCC system 200 is configured to monitor energy usage at the ED system 300. The ED system 300 monitors energy usage at one or more users 150, 160 (shown in FIG. 1) and sends energy usage information to the EC system 400. The EC system 400 processes the energy usage information and generates one or more energy delivery parameters $C_{ED}$, which it sends to the ER system 500. The ER system 500 receives the one or more energy delivery parameters $C_{ED}$ and adjusts the electrical power $E_{Supply}(t)$ supplied to the users 150, 160 based on the received energy delivery parameters $C_{ED}$. The EVP system 600 receives the weather data and the energy usage data and calculates the energy usage improvement from the VCC.

The VCC system 200 minimizes power system losses, reduces user energy consumption and provides precise user voltage control. The VCC system 200 may include a closed loop process control application that uses user voltage data provided by the ED system 300 to control, for example, a voltage set point $V_{SP}$ on a distribution circuit (not shown) within the ER system 500. That is, the VCC system 200 may control the voltages $V_{Supply}(t)$ of the electrical power $E_{Supply}(t)$ supplied to the users 150, 160, by adjusting the voltage set point $V_{SP}$ of the distribution circuit in the ER system 500, which may include, for example, one or more load tap changing (LTC) transformers, one or more voltage regulators, or other voltage controlling equipment to maintain a tighter band of operation of the voltages $V_{Delivered}(t)$ of the electric power $E_{Delivered}(t)$ delivered to the users 150, 160, to lower power losses and facilitate efficient use of electrical power $E_{Delivered}(t)$ at the user locations 150 or 160.

The VCC system 200 controls or adjusts the voltage $V_{Supply}(t)$ of the electrical power $E_{Supply}(t)$ supplied from the EC system 500 based on smart meter data, which includes measured voltage $V_{Meter}(t)$ data from the users 150, 160 in the ED system 300, and based on validation data from the EVP system 600. The VCC system 200 may adjust the voltage set point $V_{SP}$ at the substation or line regulator level in the ER system 500 by, for example, adjusting the LTC transformer (not shown), circuit regulators (not shown), may include a safe nominal operating range.

The VCC system 200 is configured to maintain the electrical power $E_{Delivered}(t)$ delivered to the users 150, 160 within one or more voltage bands $V_{Band-n}$. For example, the energy may be delivered in two or more voltage bands $V_{Band-n}$ substantially simultaneously, where the two or more voltage bands may be substantially the same or different. The value $V_{Band-n}$ may be determined by the following expression [1]:

$$V_{Band-n} = V_{SP} + \Delta V \quad [1]$$

where $V_{Band-n}$ is a range of voltages, n is a positive integer greater than zero corresponding to the number of voltage bands $V_{Band}$ that may be handled at substantially the same time, $V_{SP}$ is the voltage set point value and $\Delta V$ is a voltage deviation range.

For example, the VCC system 200 may maintain the electrical power $E_{Delivered}(t)$ delivered to the users 150, 160 within a band $V_{Band-1}$ equal to, for example, 111V to 129V for rural applications, where $V_{SP}$ is set to 120V and $\Delta V$ is set to a deviation of seven-and-one-half percent (+/−7.5%). Similarly, the VCC system 200 may maintain the electrical power $E_{Delivered}(t)$ delivered to the users 150, 160 within a band $V_{Band-2}$ equal to, for example, 114V to 126V for urban applications, where $V_{SP}$ is set to 120V and $\Delta V$ is set to a deviation of five (+/−5%).

The VCC system 200 may maintain the electrical power $E_{Delivered}(t)$ delivered to the users 150, 160 at any voltage band $V_{Band-n}$ usable by the users 150, 160, by determining appropriate values for $V_{SP}$ and $\Delta V$. In this regard, the values $V_{SP}$ and $\Delta V$ may be determined by the EC system 400 based on the energy usage information for users 150, 160, received from the ED system 300.

The EC system 400 may send the $V_{SP}$ and $\Delta V$ values to the ER system 500 as energy delivery parameters $C_{ED}$, which may also include the value $V_{Band-n}$. The ER system 500 may then control and maintain the voltage $E_{Delivered}(t)$ of the electrical power $E_{Delivered}(t)$ delivered to the users 150, 160, within the voltage band $V_{Band-n}$. The energy delivery parameters $C_{ED}$ may further include, for example, load-tap-changer (LTC) control commands.

The EVP system 600 may further measure and validate energy savings by comparing energy usage by the users 150, 160 before a change in the voltage set point value $V_{SP}$ (or voltage band $V_{Band-n}$) to the energy usage by the users 150, 160 after a change in the voltage set point value $V_{SP}$ (or voltage band $V_{Band-n}$), according to principles of the disclosure. These measurements and validations may be used to determine the effect in overall energy savings by, for example, lowering the voltage $V_{Delivered}(t)$ of the electrical power $E_{Delivered}(t)$ delivered to the users 150, 160, and to determine optimal delivery voltage bands $V_{Band-n}$ for the energy power $E_{Delivered}(t)$ delivered to the users 150, 160.

ER System 500

The ER system 500 may communicate with the ED system 300 and/or EC system 400 by means of the network 170. The ER system 500 is coupled to the network 170 and the EC system 400 by means of communication links 510 and 430, respectively. The EC system 500 is also coupled to the ED system 300 by means of the power lines 340, which may include communication links.

The ER system 500 includes a substation 530 which receives the electrical power supply $E_{In}(t)$ from, for example, the power generating station 110 (shown in FIG. 1) on a line 520. The electrical power $E_{In}(t)$ includes a voltage $V_{In}(t)$ component and a current $I_{In}(t)$ component. The substation 530 adjustably transforms the received electrical power $E_{In}(t)$ to, for example, reduce (or step-down) the voltage component $V_{In}(t)$ of the electrical power $E_{In}(t)$ to a voltage value $V_{Supply}(t)$ of the electrical power $E_{Supply}(t)$ supplied to the plurality of smart meters 330 on the power supply lines 340.

The substation 530 may include a transformer (not shown), such as, for example, a load tap change (LTC) transformer. In this regard, the substation 530 may further include an automatic tap changer mechanism (not shown), which is configured to automatically change the taps on the LTC transformer. The tap changer mechanism may change the taps on the LTC transformer either on-load (on-load tap changer, or OLTC) or off-load, or both. The tap changer mechanism may be motor driven and computer controlled. The substation 530 may also include a buck/boost transformer to adjust and maximize the power factor of the electrical power $E_{Delivered}(t)$ supplied to the users on power supply lines 340.

Additionally (or alternatively), the substation 530 may include one or more voltage regulators, or other voltage controlling equipment, as known by those having ordinary skill in the art, that may be controlled to maintain the output the voltage component $V_{Supply}(t)$ of the electrical power $E_{Supply}(t)$ at a predetermined voltage value or within a predetermined range of voltage values.

The substation 530 receives the energy delivery parameters $C_{ED}$ from the EC system 400 on the communication link 430. The energy delivery parameters $C_{ED}$ may include, for example, load tap coefficients when an LTC transformer is used to step-down the input voltage component $V_{In}(t)$ of the electrical power $E_{In}(t)$ to the voltage component $V_{Supply}(t)$ of the electrical power $E_{Supply}(t)$ supplied to the ED system 300. In this regard, the load tap coefficients may be used by the ER system 500 to keep the voltage component $V_{Supply}(t)$ on the low-voltage side of the LTC transformer at a predetermined voltage value or within a predetermined range of voltage values.

The LTC transformer may include, for example, seventeen or more steps (thirty-five or more available positions), each of which may be selected based on the received load tap coefficients. Each change in step may adjust the voltage component $V_{Supply}(t)$ on the low voltage side of the LTC transformer by as little as, for example, about five-sixteenths (0.3%), or less.

Alternatively, the LTC transformer may include fewer than seventeen steps. Similarly, each change in step of the LTC transformer may adjust the voltage component $V_{Supply}(t)$ on the low voltage side of the LTC transformer by more than, for example, about five-sixteenths (0.3%).

The voltage component $V_{Supply}(t)$ may be measured and monitored on the low voltage side of the LTC transformer by, for example, sampling or continuously measuring the voltage component $V_{Supply}(t)$ of the stepped-down electrical power $E_{Supply}(t)$ and storing the measured voltage component $V_{Supply}(t)$ values as a function of time t in a storage (not shown), such as, for example, a computer readable medium. The voltage component $V_{Supply}(t)$ may be monitored on, for example, a substation distribution bus, or the like. Further, the voltage component $V_{Supply}(t)$ may be measured at any point where measurements could be made for the transmission or distribution systems in the ER system 500.

Similarly, the voltage component $V_{In}(t)$ of the electrical power $E_{In}(t)$ input to the high voltage side of the LTC transformer may be measured and monitored. Further, the current component $I_{Supply}(t)$ of the stepped-down electrical power $E_{Supply}(t)$ and the current component $I_{In}(t)$ of the electrical power $E_{In}(t)$ may also be measured and monitored. In this regard, a phase difference $\phi_{In}(t)$ between the voltage $V_{In}(t)$ and current $I_{In}(t)$ components of the electrical power $E_{In}(t)$ may be determined and monitored. Similarly, a phase difference $\phi_{Supply}(t)$ between the voltage $V_{Supply}(t)$ and current $I_{Supply}(t)$ components of the electrical energy supply $E_{Supply}(t)$ may be determined and monitored.

The ER system 500 may provide electrical energy supply status information to the EC system 400 on the communication links 430 or 510. The electrical energy supply information may include the monitored voltage component $V_{Supply}(t)$. The electrical energy supply information may further include the voltage component $V_{In}(t)$, current components $I_{In}(t)$, $I_{Supply}(t)$, and/or phase difference values $\phi_{In}(t)$, $\phi_{Supply}(t)$, as a function of time t. The electrical energy supply status information may also include, for example, the load rating of the LTC transformer.

The electrical energy supply status information may be provided to the EC system 400 at periodic intervals of time, such as, for example, every second, 5 sec., 10 sec., 30 sec., 60 sec., 120 sec., 600 sec., or any other value within the scope and spirit of the disclosure, as determined by one having ordinary skill in the art. The periodic intervals of time may be set by the EC system 400 or the ER system 500. Alternatively, the electrical energy supply status information may be provided to the EC system 400 or ER system 500 intermittently.

Further, the electrical energy supply status information may be forwarded to the EC system 400 in response to a request by the EC system 400, or when a predetermined event is detected. The predetermined event may include, for example, when the voltage component $V_{Supply}(t)$ changes by an amount greater (or less) than a defined threshold value $V_{SupplyThreshold}$ (for example, 130V) over a predetermined interval of time, a temperature of one or more components in the ER system 500 exceeds a defined temperature threshold, or the like.

ED System 300

The ED system 300 includes a plurality of smart meters 330. The ED system 300 may further include at least one collector 350, which is optional. The ED system 300 may be coupled to the network 170 by means of a communication link 310. The collector 350 may be coupled to the plurality of smart meters 330 by means of a communication link 320. The smart meters 330 may be coupled to the ER system 500 by means of one or more power supply lines 340, which may also include communication links.

Each smart meter 330 is configured to measure, store and report energy usage data by the associated users 150, 160 (shown in FIG. 1). Each smart meter 330 is further configured to measure and determine energy usage at the users 150, 160, including the voltage component $V_{Meter}(t)$ and current component $I_{Meter}(t)$ of the electrical power $E_{Meter}(t)$ used by the users 150, 160, as a function of time. The smart meters 330 may measure the voltage component $V_{Meter}(t)$ and current component $I_{Meter}(t)$ of the electrical power $E_{Meter}(t)$ at discrete times $t_s$, where s is a sampling period, such as, for example, s=5 sec., 10 sec., 30 sec., 60 sec., 300 sec., 600 sec., or more. For example, the smart meters 330 may measure energy usage every, for example, minute ($t_{60\,sec}$), five minutes ($t_{300\,sec}$), ten minutes ($t_{600\,sec}$), or more, or at time intervals variably set by the smart meter 330 (for example, using a random number generator).

The smart meters 330 may average the measured voltage $V_{Meter}(t)$ and/or $I_{Meter}(t)$ values over predetermined time intervals (for example, 5 min., 10 min., 30 min., or more). The smart meters 330 may store the measured electrical power usage $E_{Meter}(t)$ including the measured voltage component $V_{Meter}(t)$ and/or current component $I_{Meter}(t)$ as smart meter data in a local (or remote) storage (not shown), such as, for example, a computer readable medium.

Each smart meter 330 is also capable of operating in a "report-by-exception" mode for any voltage $V_{Meter}(t)$ current $I_{Meter}(t)$, or energy usage $E_{Meter}(t)$ that falls outside of a target component band. The target component band may include, a target voltage band, a target current band, or a target energy usage band. In the "report-by-exception" mode, the smart meter 330 may sua sponte initiate communication and send smart meter data to the EC system 400. The "report-by-exception" mode may be used to reconfigure the smart meters 330 used to represent, for example, the lowest voltages on the circuit as required by changing system conditions.

The smart meter data may be periodically provided to the collector 350 by means of the communication links 320. Additionally, the smart meters 330 may provide the smart meter data in response to a smart meter data request signal received from the collector 350 on the communication links 320.

Alternatively (or additionally), the smart meter data may be periodically provided directly to the EC system 400 (for example, the MAS 460) from the plurality of smart meters, by means of, for example, communication links 320, 410 and network 170. In this regard, the collector 350 may be bypassed, or eliminated from the ED system 300. Furthermore, the smart meters 330 may provide the smart meter data directly to the EC system 400 in response to a smart meter data request signal received from the EC system 400. In the absence of the collector 350, the EC system (for example, the MAS 460) may carry out the functionality of the collector 350 described herein.

The request signal may include, for example, a query (or read) signal and a smart meter identification signal that identifies the particular smart meter 330 from which smart meter data is sought. The smart meter data may include the following information for each smart meter 130, including, for example, kilo-Watt-hours (kWh) delivered data, kWh received data, kWh delivered plus kWh received data, kWh delivered minus kWh received data, voltage level data, current level data, phase angle between voltage and current, kVar data, time interval data, demand data, and the like.

Additionally, the smart meters 330 may send the smart meter data to the meter automation system server MAS 460. The smart meter data may be sent to the MAS 460 periodically according to a predetermined schedule or upon request from the MAS 460.

The collector 350 is configured to receive the smart meter data from each of the plurality of smart meters 330 via the communication links 320. The collector 350 stores the received smart meter data in a local storage (not shown), such as, for example, a computer readable medium. The collector 350 compiles the received smart meter data into a collector data. In this regard, the received smart meter data may be aggregated into the collector data based on, for example, a geographic zone in which the smart meters 330 are located, a particular time band (or range) during which the smart meter data was collected, a subset of smart meters 330 identified in a collector control signal, and the like. In compiling the received smart meter data, the collector 350 may average the voltage component $V_{Meter}(t)$ values received in the smart meter data from all (or a subset of all) of the smart meters 330.

The EC system 400 is able to select or alter a subset of all of the smart meters 330 to be monitored for predetermined time intervals, which may include for example 15 minute intervals. It is noted that the predetermined time intervals may be shorter or longer than 15 minutes. The subset of all of the smart meters 330 is selectable and can be altered by the EC system 400 as needed to maintain minimum level control of the voltage $V_{Supply}(t)$ supplied to the smart meters 330.

The collector 350 may also average the electrical power $E_{Meter}(t)$ values received in the smart meter data from all (or a subset of all) of the smart meters 330. The compiled collector data may be provided by the collector 350 to the EC system 400 by means of the communication link 310 and network 170. For example, the collector 350 may send the compiled collector data to the MAS 460 (or ROC 490) in the EC system 400.

The collector 350 is configured to receive collector control signals over the network 170 and communication link 310 from the EC system 400. Based on the received collector control signals, the collector 350 is further configured to select particular ones of the plurality of smart meters 330 and query the meters for smart meter data by sending a smart meter data request signal to the selected smart meters 330. The collector 350 may then collect the smart meter data that it receives from the selected smart meters 330 in response to the queries. The selectable smart meters 330 may include any one or more of the plurality of smart meters 330. The collector control signals may include, for example, an identification of the smart meters 330 to be queried (or read), time(s) at which the identified smart meters 330 are to measure the $V_{Meter}(t)$, $I_{Meter}(t)$, $E_{Meter}(t)$ and/or $\phi_{Meter}(t)$ ($\phi_{Meter}(t)$ is the phase difference between the voltage $V_{Meter}(t)$ and current $I_{Meter}(t)$ components of the electrical power $E_{Meter}(t)$ measured at the identified smart meter 330), energy usage information since the last reading from the identified smart meter 330, and the like. The collector 350 may then compile and send the compiled collector data to the MAS 460 (and/or ROC 490) in the EC system 400.

EC System 400

The EC system 400 may communicate with the ED system 300 and/or ER system 500 by means of the network 170. The EC system 400 is coupled to the network 170 by means of one or more communication links 410. The EC system 400 may also communicate directly with the ER system 500 by means of a communication link 430.

The EC system 400 includes the MAS 460, a database (DB) 470, a distribution management system (DMS) 480, and a regional operation center (ROC) 490. The ROC 490 may include a computer (ROC computer) 495, a server (not shown) and a database (not shown). The MAS 460 may be coupled to the DB 470 and DMS 480 by means of communication links 420 and 440, respectively. The DMS 480 may be coupled to the ROC 490 and ER SYSTEM 500 by means of the communication link 430. The database 470 may be located at the same location as (for example, proximate to, or within) the MAS 460, or at a remote location that may be accessible via, for example, the network 170.

The EC system 400 is configured to de-select, from the subset of monitored smart meters 330, a smart meter 330 that the EC system 400 previously selected to monitor, and select the smart meter 330 that is outside of the subset of monitored smart meters 330, but which is operating in the report-by-exception mode. The EC system 400 may carry out this change after receiving the sua sponte smart meter data from the non-selected smart meter 330. In this regard, the EC system 400 may remove or terminate a connection to the de-selected smart meter 330 and create a new connection to the newly selected smart meter 330 operating in the report-by-exception mode. The EC system 400 is further configured to select any one or more of the plurality of smart meters 330 from which it receives smart meter data comprising, for example, the lowest measured voltage component $V_{Meter}(t)$ and generate an energy delivery parameter $C_{ED}$ based on the smart meter data received from the smart meter(s) 330 that provide the lowest measured voltage component $V_{Meter}(t)$.

The MAS 460 may include a computer (not shown) that is configured to receive the collector data from the collector 350, which includes smart meter data collected from a selected subset (or all) of the smart meters 330. The MAS 460 is further configured to retrieve and forward smart meter data to the ROC 490 in response to queries received from the ROC 490. The MAS 460 may store the collector data, including smart meter data in a local storage and/or in the DB 470.

The DMS 480 may include a computer that is configured to receive the electrical energy supply status information from the substation 530. The DMS 480 is further configured to retrieve and forward measured voltage component $V_{Meter}(t)$ values and electrical power $E_{Meter}(t)$ values in response to queries received from the ROC 490. The DMS 480 may be further configured to retrieve and forward measured current component $I_{Meter}(t)$ values in response to queries received from the ROC 490. The DMS 480 also may be further configured to retrieve all "report-by-exception" voltages $V_{Meter}(t)$ from the smart meters 330 operating in the "report-by-exception" mode and designate the voltages $V_{Meter}(t)$ as one of the control points to be continuously read at predetermined times (for example, every 15 minutes, or less (or more), or at varying times). The "report-by-exception voltages $V_{Meter}(t)$ may be used to control the EC 500 set points.

The DB 470 may include a plurality of relational databases (not shown). The DB 470 includes a large number of records that include historical data for each smart meter 330, each collector 350, each substation 530, and the geographic area(s) (including latitude, longitude, and altitude) where the smart meters 330, collectors 350, and substations 530 are located.

For instance, the DB 470 may include any one or more of the following information for each smart meter 330, including: a geographic location (including latitude, longitude, and altitude); a smart meter identification number; an account number; an account name; a billing address; a telephone number; a smart meter type, including model and serial number; a date when the smart meter was first placed into use; a time stamp of when the smart meter was last read (or queried); the smart meter data received at the time of the last reading; a schedule of when the smart meter is to be read (or queried), including the types of information that are to be read; and the like.

The historical smart meter data may include, for example, the electrical power $E_{Meter}(t)$ used by the particular smart meter 330, as a function of time. Time t may be measured in, for example, discrete intervals at which the electrical power $E_{Meter}$ magnitude (kWh) of the received electrical power $E_{Meter}(t)$ is measured or determined at the smart meter 330. The historical smart meter data includes a measured voltage $E_{Meter}(t)$ component $V_{Meter}(t)$ of the electrical energy $E_{Meter}(t)$ received at the smart meter 330. The historical smart meter data may further include a measured current component $I_{Meter}(t)$ and/or phase difference $\phi_{Meter}(t)$ of the electrical power $E_{Meter}(t)$ (t) received at the smart meter 330.

As noted earlier, the voltage component $V_{Meter}(t)$ may be measured at a sampling period of, for example, every five seconds, ten seconds, thirty seconds, one minute, five minutes, ten minutes, fifteen minutes, or the like. The current component $I_{Meter}(t)$ and/or the received electrical power $E_{Meter}(t)$ values may also be measured at substantially the same times as the voltage component $V_{Meter}(t)$.

Given the low cost of memory, the DB 470 may include historical data from the very beginning of when the smart meter data was first collected from the smart meters 330 through to the most recent smart meter data received from the smart meter 330s.

The DB 470 may include a time value associated with each measured voltage component $V_{Meter}(t)$, current component $I_{Meter}(t)$, phase component $\phi_{Meter}(t)$ and/or electrical power $E_{Meter}(t)$, which may include a timestamp value generated at the smart meter 330. The timestamp value may include, for example, a year, a month, a day, an hour, a minute, a second, and a fraction of a second. Alternatively, the timestamp may be a coded value which may be decoded to determine a year, a month, a day, an hour, a minute, a second, and a fraction of a second, using, for example, a look up table. The ROC 490 and/or smart meters 330 may be configured to receive, for example, a WWVB atomic clock signal transmitted by the U.S. National Institute of Standards and Technology (NIST), or the like and synchronize its internal clock (not shown) to the WWVB atomic clock signal.

The historical data in the DB 470 may further include historical collector data associated with each collector 350. The historical collector data may include any one or more of the following information, including, for example: the particular smart meters 330 associated with each collector 350; the geographic location (including latitude, longitude, and altitude) of each collector 350; a collector type, including model and serial number; a date when the collector 350 was first placed into use; a time stamp of when collector data was last received from the collector 350; the collector data that was received; a schedule of when the collector 350 is expected to send collector data, including the types of information that are to be sent; and the like.

The historical collector data may further include, for example, an external temperature value $T_{Collector}(t)$ measured outside of each collector 350 at time t. The historical collector data may further include, for example, any one or more of the following for each collector 350: an atmospheric pressure value $P_{Collector}(t)$ measured proximate the collector 350 at time t; a humidity value $H_{Collector}(t)$ measured proximate the collector 350 at time t; a wind vector value $W_{Collector}(t)$ measured proximate the collector 350 at time t, including direction and magnitude of the measured wind; a solar irradiant value $L_{Collector}(t)$ (kW/m$^2$) measured proximate the collector 350 at time t; and the like.

The historical data in the DB 470 may further include historical substation data associated with each substation 530. The historical substation data may include any one or more of the following information, including, for example: the identifications of the particular smart meters 330 supplied with electrical energy $E_{Supply}(t)$ by the substation 530; the geographic location (including latitude, longitude, and altitude) of the substation 530; the number of distribution circuits; the number of transformers; a transformer type of each transformer, including model, serial number and maximum Megavolt Ampere (MVA) rating; the number of voltage regulators; a voltage regulator type of each voltage regulator, including model and serial number; a time stamp of when substation data was last received from the substation 530; the substation data that was received; a schedule of when the substation 530 is expected to provide electrical energy supply status information, including the types of information that are to be provided; and the like.

The historical substation data may include, for example, the electrical power $E_{Supply}(t)$ supplied to each particular smart meter 330, where $E_{Supply}(t)$ is measured or determined at the output of the substation 530. The historical substation data includes a measured voltage component $V_{Supply}(t)$ of the supplied electrical power $E_{Supply}(t)$, which may be measured, for example, on the distribution bus (not shown) from the transformer. The historical substation data may further include a measured current component $I_{Supply}(t)$ of the supplied electrical power $E_{supply}(t)$. As noted earlier, the voltage component $V_{Supply}(t)$, the current component $I_{Supply}(t)$, and/or the electrical power $E_{Supply}(t)$ may be measured at a sampling period of, for example, every five seconds, ten seconds, thirty seconds, a minute, five minutes, ten minutes, or the like. The historical substation data may further include a phase difference value $\phi_{Supply}(t)$ between the voltage $V_{Supply}(t)$ and current $I_{Supply}(t)$ signals of the electrical power $E_{Supply}(t)$, which may be used to determine the power factor of the electrical power $E_{Supply}(t)$ supplied to the smart meters 330.

The historical substation data may further include, for example, the electrical power $E_{In}(t)$ received on the line 520 at the input of the substation 530, where the electrical power $E_{In}(t)$ is measured or determined at the input of the substation 530. The historical substation data may include a measured voltage component $V_{In}(t)$ of the received electrical power $E_{In}(t)$, which may be measured, for example, at the input of the transformer. The historical substation data may further include a measured current component $I_{In}(t)$ of the received electrical power $E_{In}(t)$. As noted earlier, the voltage component $V_{In}(t)$, the current component $I_{In}(t)$, and/or the electrical power $E_{In}(t)$ may be measured at a sampling period of, for example, every five seconds, ten seconds, thirty seconds, a minute, five minutes, ten minutes, or the like. The historical substation data may further include a phase difference $\phi_{In}(t)$ between the voltage component $V_{In}(t)$ and current component $I_{In}(t)$ of the electrical power $E_{In}(t)$. The power factor of the electrical power $E_{In}(t)$ may be determined based on the phase difference $\phi_{In}(t)$.

According to an aspect of the disclosure, the EC system 400 may save aggregated kW data at the substation level, voltage data at the substation level, and weather data to compare to energy usage per smart meter 330 to determine the energy savings from the VCC system 200, and using linear regression to remove the effects of weather, load growth, economic effects, and the like, from the calculation.

In the VCC system 200, control may be initiated from, for example, the ROC computer 495. In this regard, a control screen 305 may be displayed on the ROC computer 495, as shown, for example, in FIG. 3 of US publication 2013/0030591. The control screen 305 may correspond to data for a particular substation 530 (for example, the TRABUE SUBSTATION) in the ER system 500. The ROC computer 495 can control and override (if necessary), for example, the substation 530 load tap changing transformer based on, for example, the smart meter data received from the ED system 300 for the users 150, 160. The ED system 300 may determine the voltages of the electrical power supplied to the user locations 150, 160, at predetermined (or variable) intervals, such as, e.g., on average each 15 minutes, while maintaining the voltages within required voltage limits.

For system security, the substation 530 may be controlled through the direct communication link 430 from the ROC 490 and/or DMS 480, including transmission of data through communication link 430 to and from the ER 500, EUS 300 and EVP 600.

Furthermore, an operator can initiate a voltage control program on the ROC computer 490, overriding the controls, if necessary, and monitoring a time it takes to read the user voltages $V_{Meter}(t)$ being used for control of, for example, the substation LTC transformer (not shown) in the ER system 500.

Figure 3:
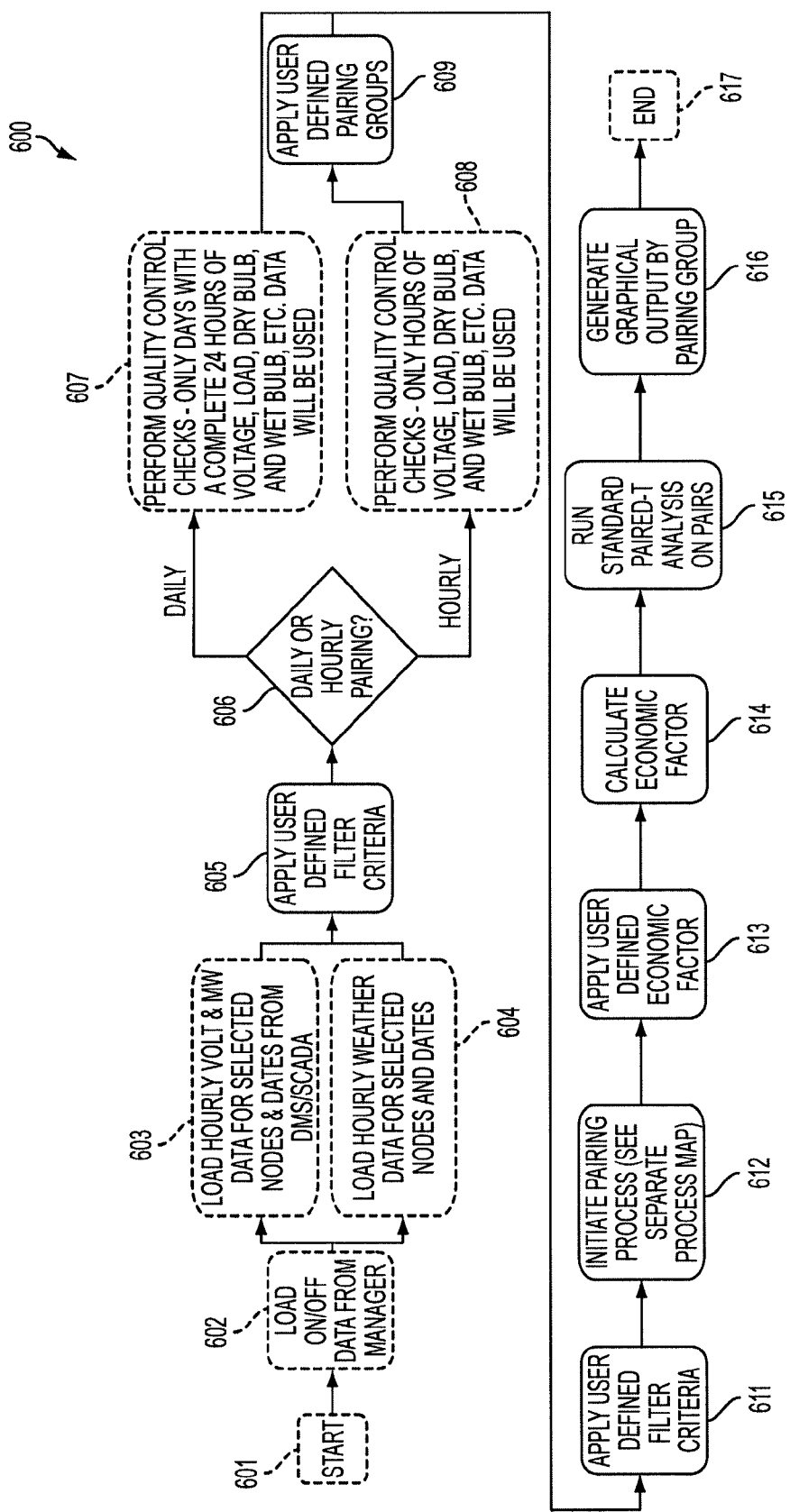
FIG. 3 shows an example of an Energy Validation Process (EVP) according to principles of the disclosure.

FIG. 3 shows the energy validation process 600 for determining the amount of conservation in energy per customer realized by operating the VCC system in FIGS. 1-2. The process is started 601 and the data the ON and OFF periods is loaded 602 by the process manager. The next step is to collect 603 the hourly voltage and power (MW) data from the metering data points on the VCC system from the DMS 480 which may be part of a supervisory control and data acquisition (SCADA) type of industrial control system. Next the corresponding weather data is collected 604 for the same hourly conditions. The data is processed 605, 606, 607, 608 to improve its quality using filters and analysis techniques to eliminate outliers that could incorrectly affect the results, as describe further below. If hourly pairing is to be done the hourly groups are determined 609 using the linear regression techniques. The next major step is to determine 611, 612, 613, 614, 615, 616, 617 the optimal pairing of the samples, as described further below.

Figure 4:
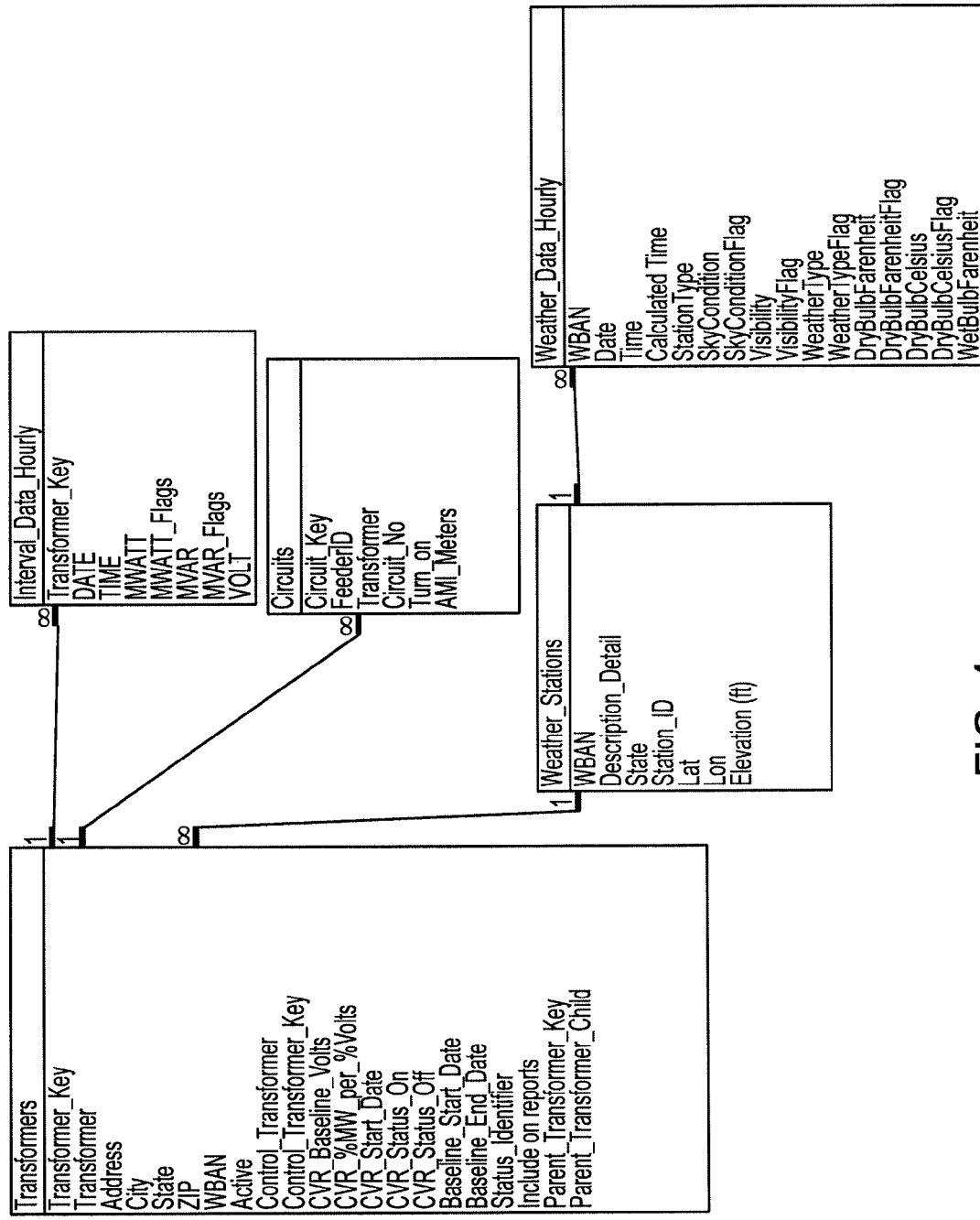
FIG. 4 shows an example of an Energy Validation Process (EVP) data base structure according to principles of the disclosure.

FIG. 4 shows an example of the database structure where the initial data for analysis is kept. This relational data base allows for fast processing of the data and marking of data that is not to be used because of the anomalies. The efficient storage of the data for continued analysis is useful to provide the evaluation performance for the EVP.

FIG. 5 shows an example of an application of the data quality reviews of the data before processing. Using the database the values are scanned for out of range levels in all categories, such as the zero MW readings 622 and the very low voltage readings 623. These are identified and removed before processing. Second, it shows repeated values, such as the repeated voltage reading of 122.331 volts in the data box 621, that are indicative of bad measurements and would severely degrade the calculation of the energy change. These are also removed from the future calculations. Known anomalies, including missing records due to daylight savings time changes 624, are removed as well.

Figure 6:
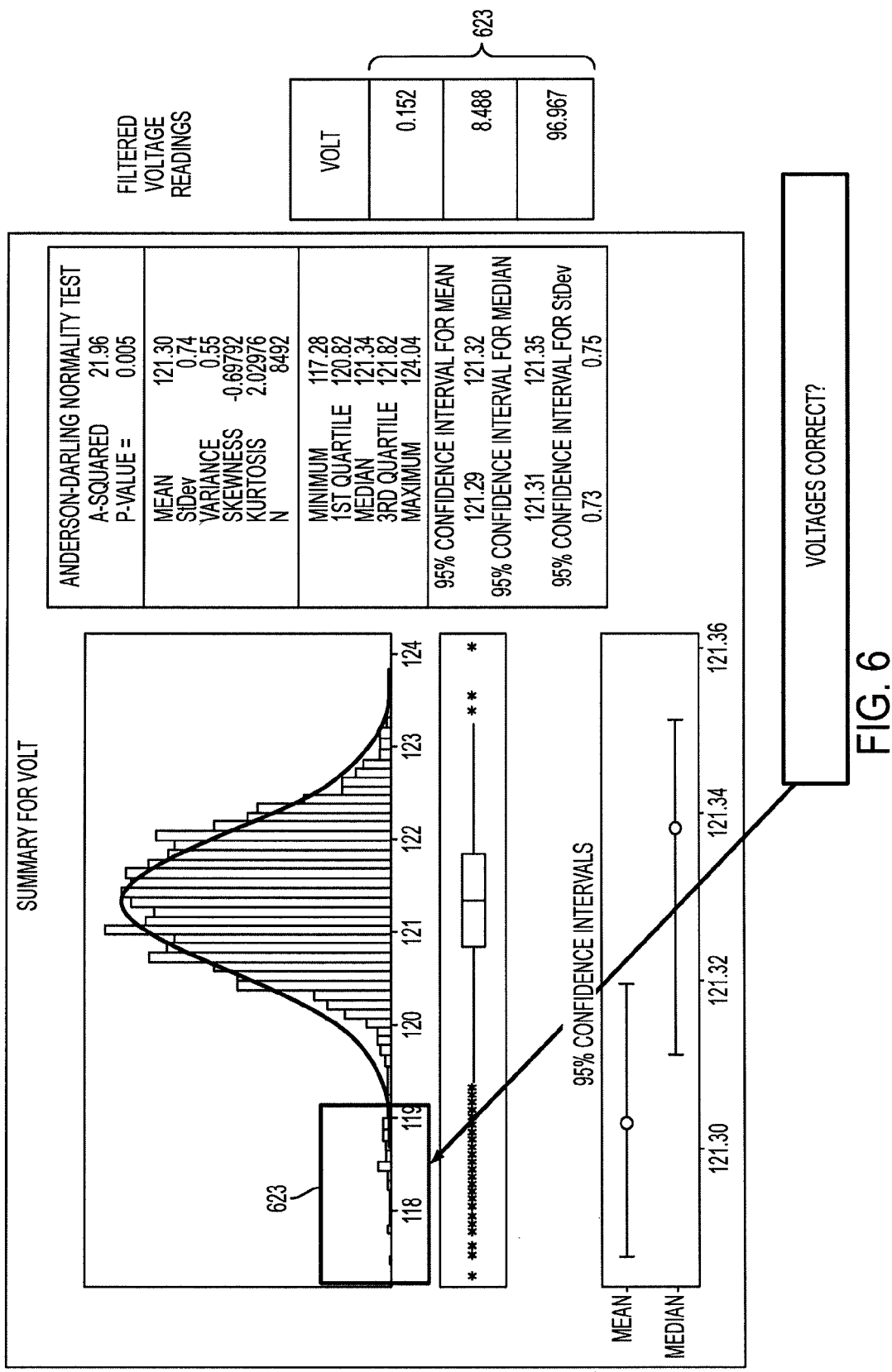
FIG. 6 shows an example of voltage outlier analysis to determine if independent variables such as voltage measurements are outside of normal operation, according to principles of the disclosure.

FIG. 6 shows an example of a frequency plot of voltage at hourly intervals. It is expected that most of the data will follow a normalized form when analyzed. This makes it easier to spot poor quality data in the outlier data as shown here. Data are reviewed using the frequency plots and the outliers are reviewed for consistency with normal operating conditions on the system. The outliers, such as voltages 623, can be eliminated if they fall outside of predetermined bands. This is an example of analysis applied to all of the variables.

Figure 7:
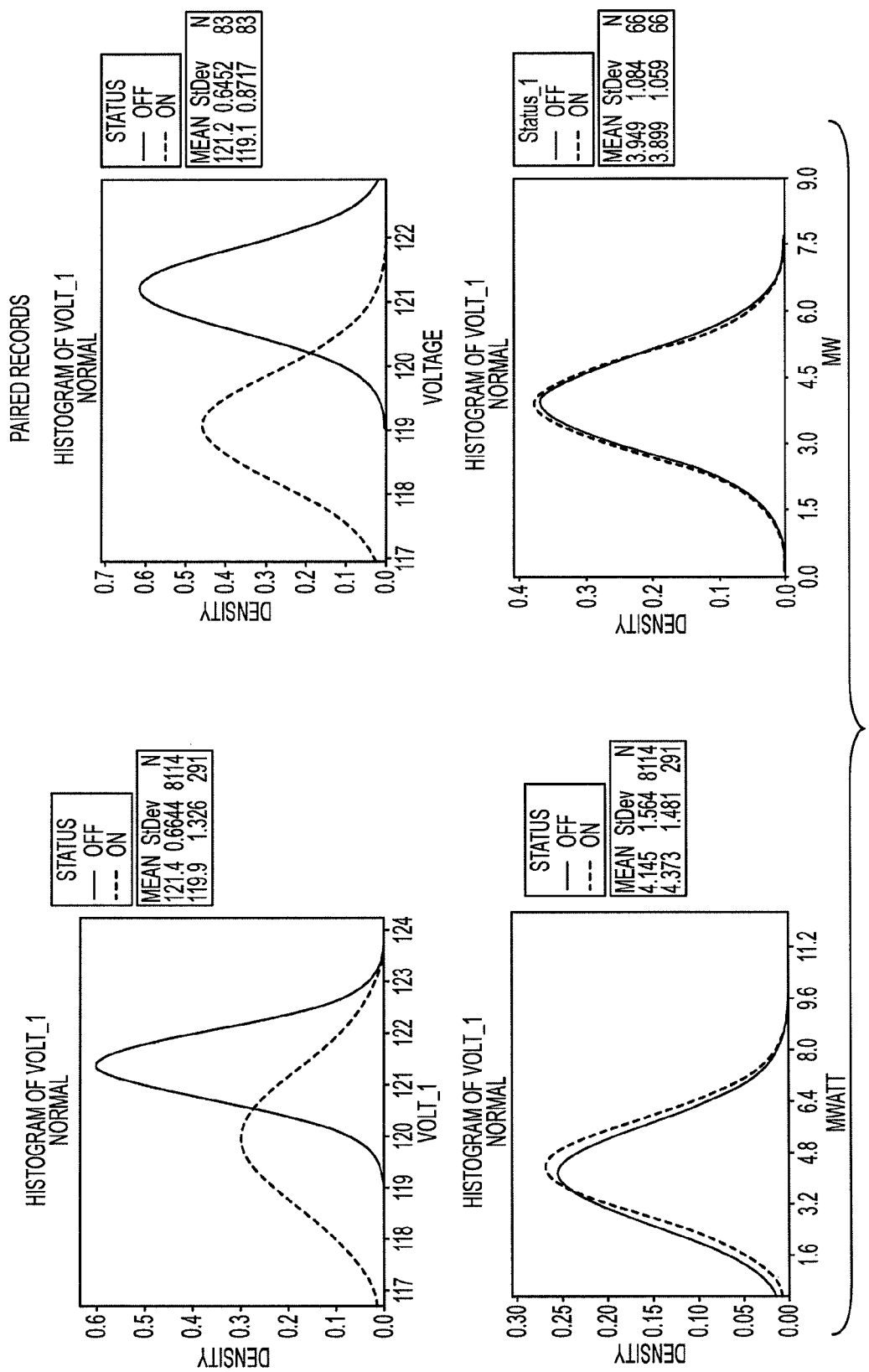
FIG. 7 shows examples of graphs of a voltage histograms of "OFF to ON" comparisons for determining the characteristics of the independent variables, according to principles of the disclosure.

FIG. 7 shows an example of histogram plots of the "OFF" to "ON" data comparisons for both voltage and MW. As is seen on the top two diagrams the voltage for the "ON" state has a significantly wider deviation that the "OFF" data. This is also a concern when the standard deviation of the comparison data does not match. Data sets having out of range or non-matching standard deviations may be filtered out. In contrast the MW data had very consistent standard deviations and very little differences in the "ON" to "OFF" state population characteristics.

Figure 8:
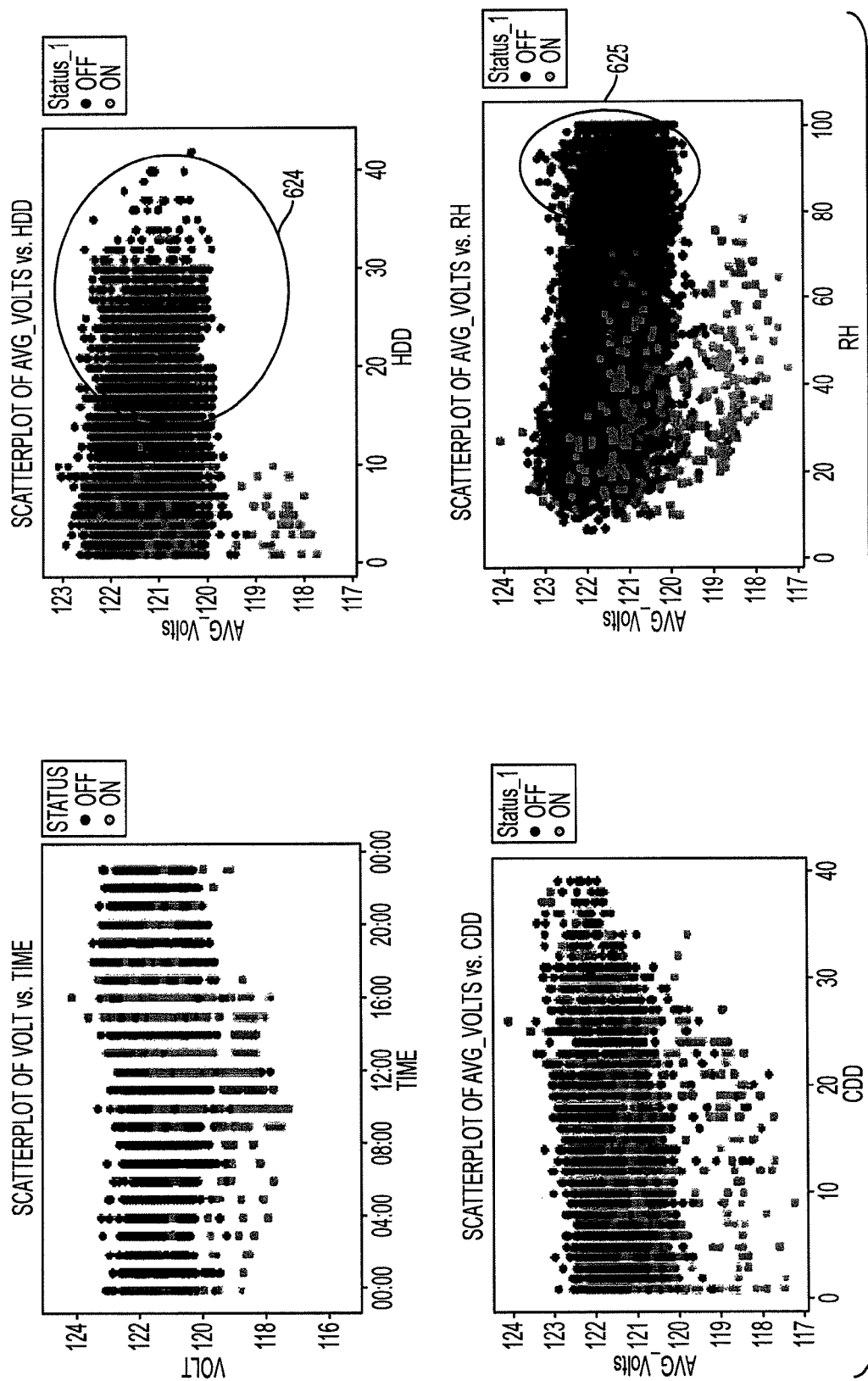
FIG. 8 shows examples of graphs of sample points by weather and season in the "ON" and "OFF" conditions to view the characteristics of the weather and seasonal shifts in each sample and sample pair.

FIG. 8 shows an example of the comparison of scatterplots of the "OFF" (black points on the scatterplots) to "ON" (red points on the scatterplots) populations by season and by group. These plots are useful for reviews of the level of the sampling across the entire performance levels. As can be seen from these examples there are a number of areas 624, 625 where there are no "ON" samples for large areas of the "OFF" performance levels. This means that more sampling will be needed to accurately represent these conservation performance zones. The quick review of the scatterplots can give a significant knowledge of the sample size and adequacy for this type of measurement.

Figure 9:
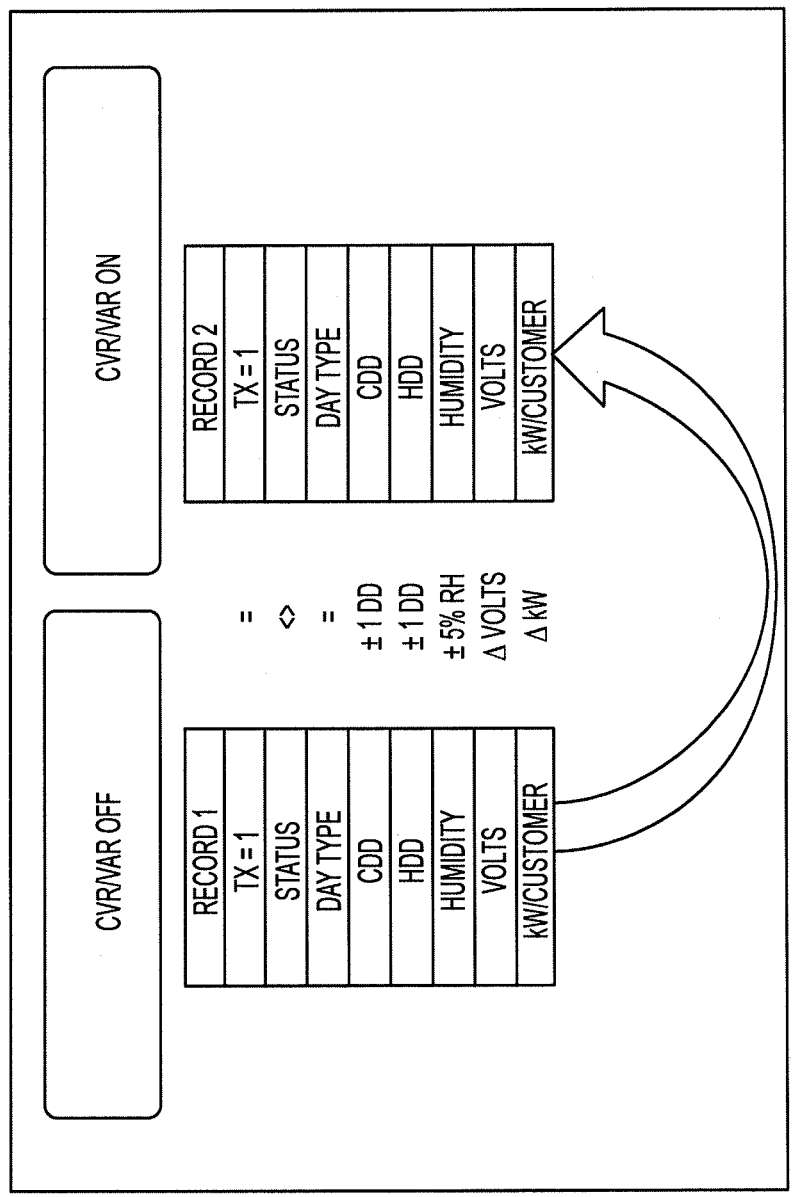
FIG. 9 shows an example of the high level pairing process for matching the weather, day type, and humidity for a population sample, according to the principles of the disclosure.

FIG. 9 shows an example of the high level pairing process which is based on a well-established statistical comparison technique called paired t. The purpose of this calculation is to compare two samples of data to determine the average shift in a variable mean from one sample set to the other. Documentation of the details of paired t analysis can be found in a number of standard statistic publications and is readily available in standard software packages. FIG. 9 is a high level description of the process being applied to the Substation 530 Transformer and ED 300 circuit MW and Voltage data. The value being calculated is the CVR factor which establishes the ratio of (a) the percent power (watts) change from sample 1 (P1) to sample 2 (P2) to (b) the percent voltage (volts) change from sample 1 (V1) to sample 2 (V2). The CVR factor=$((P1-P2)/P1)/((V1-V2)/V1)$. Sample 1 is take from the MW and Voltage data at the meter when the CVR control system is "OFF" and Sample 2 is taken from the data when CVR is "ON". A larger CVR factor indicates more power savings from reduction in voltage, with common observed CVR factors for some CVR systems being observed in the range of about 0.2 to 1.2.

Sets of samples are paired using the rules of FIG. 9. Records 1 and 2 in FIG. 9 are for Samples 1 and 2 respectively. For Samples 1 and 2: the immediately upstream transformer (TX #1) must be the same (=); the Status (e.g., whether CVR is OFF or ON) must be different (< >), the Day Type (e.g., workday, weekend or holiday) must be equal (=); Cooling degree days and heating degree days (CDD/HDD) should each be matched within plus or minus one degree day ($\pm 1$ DD), and relative humidity should be matched within plus or minus five percent ($\pm 5\%$ RH). This matching of two samples from the "OFF" and "ON" states creates one pair of samples. Once paired, the volts and power from the Samples 1 and 2 may be used for the CVR factor calculation. At least 30 of these pairs are required for the calculation of the average difference between the two sample sets to have statistical significance (about a 95% confidence level).

There are three features of the paired t analysis for the illustrated embodiment. First the paired samples are independent. This requires that for each sample taken from a data set, whether for sample 1 (OFF state) or sample 2 (ON state), the values from the sample can only be used and paired one time in the analysis. Once they are used, the samples are removed from the data sets to choose the next pair. The second feature is that the data sets are normal data sets. This is checked statistically for each analysis. Normality is checked using the Anderson-Darling normality test. Third, the number of paired t samples are greater than about 30 to be statistically significant. This calculation will be shown for each set of analysis. Once these three features are present, the paired t analysis is implemented and the average difference is determined within a confidence interval determined by the variation of the paired samples. The illustrated embodiment uses 95% confidence level for the CVR analysis.

FIG. 10 shows an example of a method used for decreasing the variation in the calculation by separating the samples into consistent groups. For the MW and Voltage data this is done by grouping the sample data into like hours that are consistent with each other. This may be done with a linear regression technique. Using linear regression, the consistency of the variables is checked. Samples taken in the same hour of the day (hours 0 through 23 in the heading of the table of FIG. 10) are grouped and are noted in the same column in FIG. 10. Sample hours that represent like data are determined by using the linear regression constants to check consistency between hours that are grouped together. In addition each data set is grouped into a seasonal grouping as well. The result of this grouping process is to first break the sample data up into the seasonal groups of winter, spring, summer and fall. Then using the linear regression break the hours for each seasonal day (0 to 23) into like groups for paired t testing. This technique will lessen the variation in the paired t calculation for average difference from one sample group to another. The table in FIG. 10 is an example of this type of process.

Figure 11:
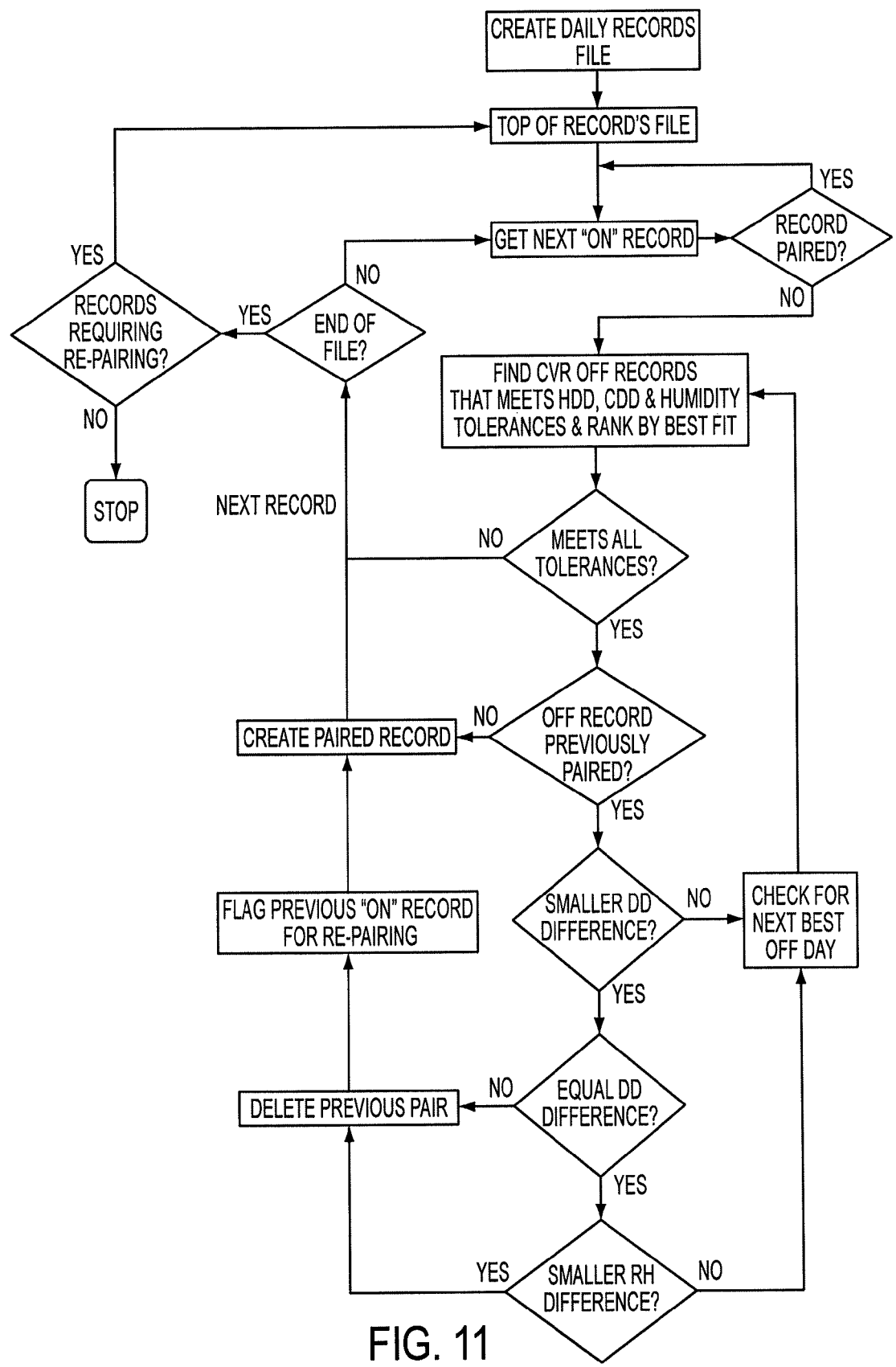
FIG. 11 shows an example of a process map of the optimal pairing process, according to the principles of the disclosure.

FIG. 11 shows the detailed pairing process for a multiple variable example of the VCC pairing both HDD/CDD along with humidity. The process creates a total list of possible matched pairs in all combinations. Each pair is scored based on a linear optimization method to weigh the independent variable appropriately based on its energy effect and use the linearization to form the optimal scoring for the pair including both independent variables of HDD/CDD and humidity using linear regression constants. For example, if the energy effect (e.g., change in CVR factor) for HDD/CDD is five times the energy effect for humidity, a difference in HDD/CDD between samples is weighted five times as much as the difference in humidity between samples.

Once this process is complete the list is reviewed for the best score. These are paired and removed from the pairing list. The process is repeated for each of the remaining pairs until all pairs have been optimally matched for variables within the tolerance levels as shown in the process diagram of FIG. 11. In this way the pairing is optimized to the population giving the best accuracy for the data available, according to the illustrated embodiment with the given criteria.

Figure 12:
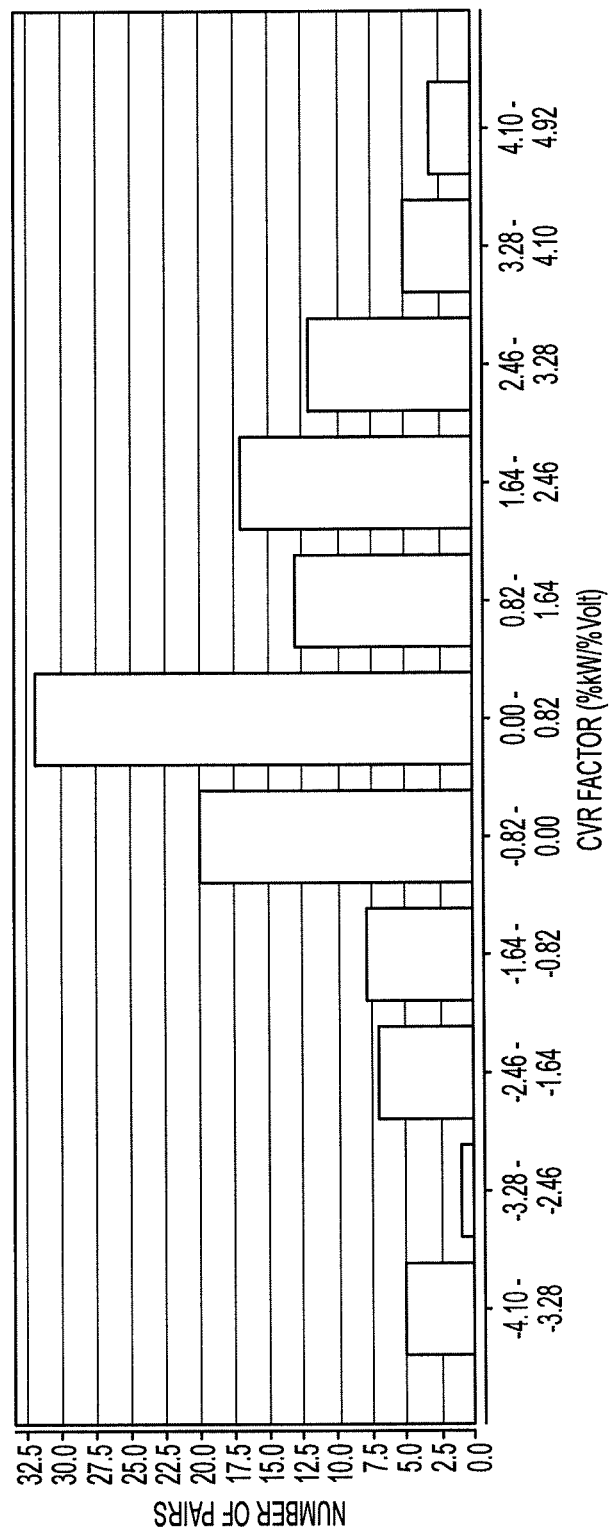
FIG. 12 shows an example of a histogram of the data pairing process to determine the CVR factor for the EEDS, according to principles of the disclosure.

FIG. 12 shows an example of the histogram of the data from the CVR factor pairing calculation. It is noted that the pairing is normalized and fits the characteristics of the t-distribution. With this information the data can be used to evaluate the range of average values of the CVR factor for the circuit during the time period the data was taken. This data can be calculated for a data set of 30 or more and will produce an accurate representation of the range of the CVR factor. Each data set requires a one-day time period. Normally the 95% confidence interval is used to determine a usable range for the CVR factor. This statistical factor is specifically for the circuit under evaluation and provides ongoing evaluation of the performance of the circuit down to a minimum of 30 data sets and thus a 30-day interval.

Figure 13:
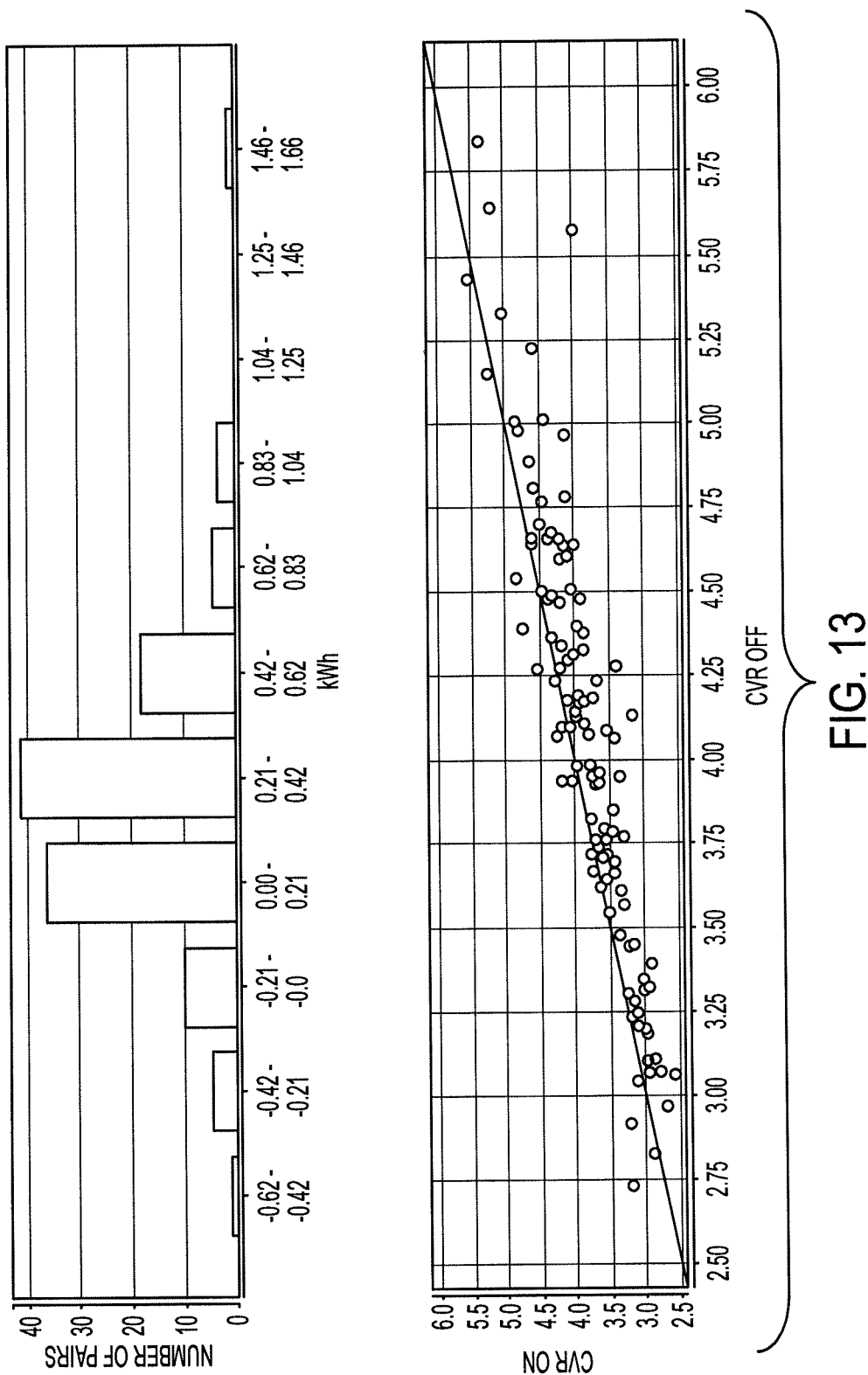
FIG. 13 shows an example of an application of a paired test analysis process determining the change in usage per customer. The top histogram represents the pairing results and the bottom scatter plot demonstrates the results of the pairing values, according to principles of the disclosure.

FIG. 13 shows an example of the histogram and the scatterplot of the energy saving per customer over the interval from the same paired t analysis. The top graph is a measure of the kW/customer change and has the same type of normalized characteristic that is compatible with the t-distribution confidence interval analysis. The scatterplot of the paired population plotted in an "OFF" to "ON" state give a quick intuitive evaluation of the paired data. In general if the majority of the pairs are below the red line the VCC system is improving the conservation, if they are equally spaced on either side of the line it is not having any effect and if they are on average above the line it is having the reverse effect. In this case it is easy to see that the samples are clearly showing improvement in conservation of energy.

Figure 14:
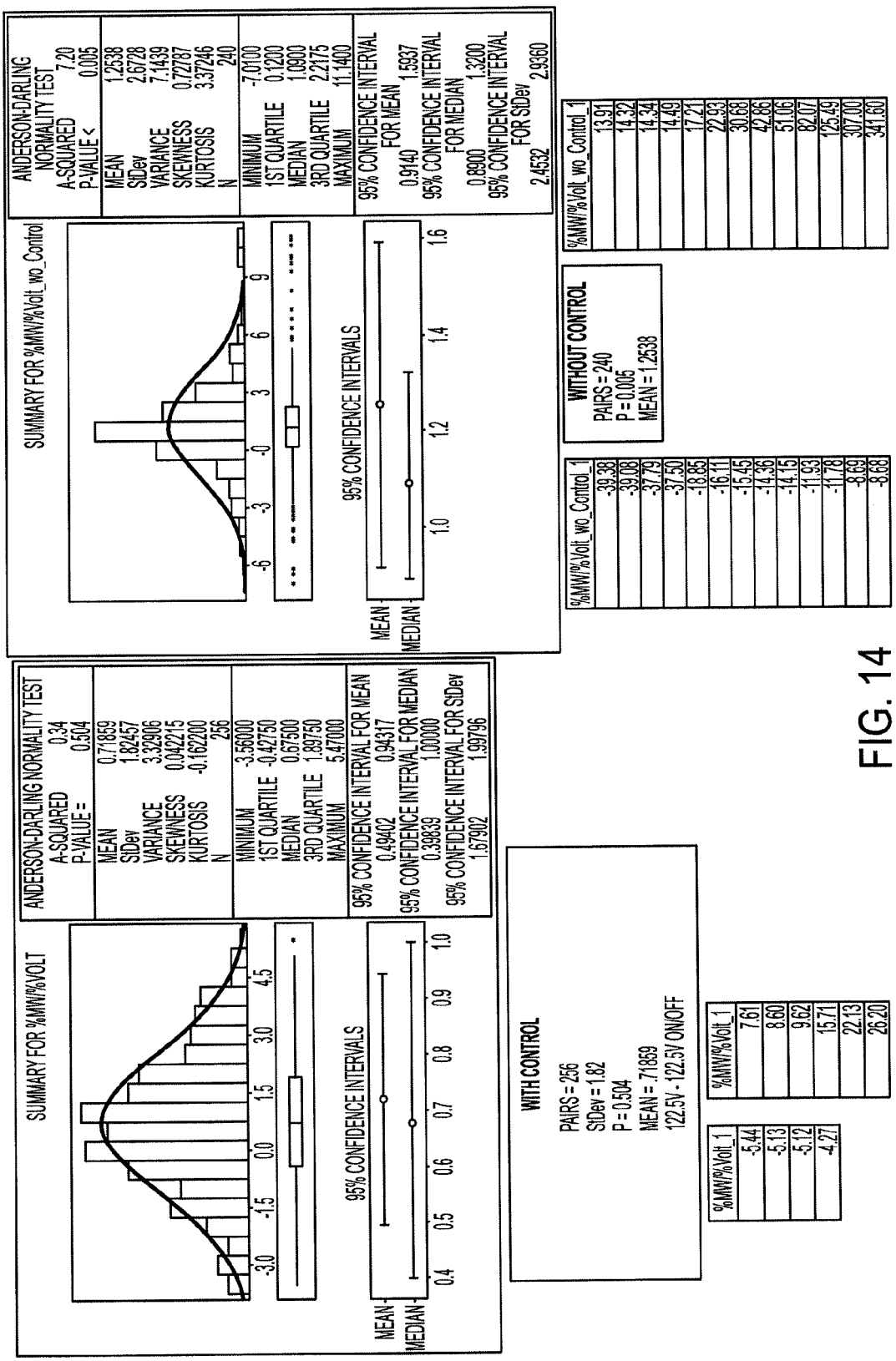
FIG. 14 shows examples of histograms of the data pairing process to determine the CVR factor for the EEDS, one with a control EEDS to remove other independent variables, and one without the control EEDS, according to principles of the disclosure.

FIG. 14 shows an alternative example of the CVR factor analysis for another circuit. The graph on the right of FIG. 14. demonstrates the characteristics for a measurement done without the control circuit being used to compensate for the other independent variables. The results show a non-normal population with a much higher CVR savings. In this case there was a substantial decrease in load because of lower electricity demand due to the downturn in the economy, thus making the CVR factor look abnormally high. The graph on the left of FIG. 14 is with the control circuit and uses the circuit to remove the non-normal effects of the negative economic growth. The CVR factor using this control circuit does decrease but the normality becomes very strong and the data is back in a normal range for the VCC control system to be the only independent variable controlling the effects.

FIG. 15 shows an example of the final calculations on both the CVR factor and the savings in energy derive from the optimal pairing of the VCC system energy. This results in a direct calculation of the capacity of the circuit to reduce energy as stated in the CVR factor. This capacity is its ability to conserve energy by reducing voltage in the lower operating band. The VCC system executes this type of control and the EVP independently calculates the capacity of the circuit to continue to conserve as other modifications to the voltage performance are implemented.

FIG. 15 also shows an example of the final calculations for energy savings during the measurement time under study. This energy savings is a continuous reporting of the circuit's ability to continue to sustain the conservation savings that were calculated for the VCC system. This ability to continuously track the performance instead of having to do repeated one time testing of the circuit to estimate the performance represents a major step forward in the technology. Existing systems are based on one time tests that greatly reduce the efficiency performance just to estimate the CVR factor and the energy saving performance. In addition they must be repeated on regular intervals to determine if the saving is being sustained. This EVP system provides a major step forward in being able to generate near metered savings without reducing the efficiency of the VCC system.

While the disclosure has been described in terms of exemplary embodiments, those skilled in the art will recognize that the disclosure can be practiced with modifications in the spirit and scope of the appended claims. These examples are merely illustrative and are not meant to be an exhaustive list of all possible designs, embodiments, applications or modifications of the disclosure.

What is claimed as new and desired to be protected by Letters Patent of the United States is:

1. A voltage control and energy conservation system measurement technique using paired t distributions to calculate without a use of weather normalization a change in energy use or improvement in conservation performance in energy reduction on a system, comprising:
    an electrical energy delivery system with a substation configured as an electrical supply system supplying power through an electrical distribution system to an electrical usage system for use by electrical usage devices at a plurality of user locations;
    a plurality of meters, wherein at least one a meter is located at the substation and at least one meter is located at the at least one of the plurality of user locations, and at least one of the plurality of meters is configured to generate smart meter data based on a measured component of electrical power received by the smart meter; and
    a voltage controller configured to generate an energy delivery parameter based on the smart meter data,
    wherein the substation is further configured to adjust a voltage set point value of the electrical power supplied to the plurality of user locations based on the energy delivery parameter, and
    wherein the voltage and energy are measured on an interval basis using an energy validation process and a change in energy characteristics, the energy characteristics including a conservation voltage reduction (CVR) factor, and an energy savings between the voltage at the CVR "ON" set point and the CVR "OFF" set point are measured using a paired t measurement using an optimized pairing process to determine the CVR factor and the energy usage improvement for the electrical energy delivery system, and wherein the paired t measurement determines an average shift in a mean energy usage, wherein the pairing process comprises an additional process that breaks the paired t process into measurements of CVR factor and conservation energy savings by season and uses linear regression constants to determine blocks of hours where consistent loads exist and paired t comparisons are configured to be calculated within predetermined limits.

2. The system of claim 1, wherein the substation is further configured to adjust a voltage set point value of the electrical power supplied at the supply point to the plurality of user locations based on the change in energy characteristics.

3. The system of claim 1, wherein the voltage controller further configured to adjust the energy delivery parameter based on the change in energy characteristics.

4. The system of claim 1, wherein the energy characteristic is the conservation voltage reduction factor.

5. The system of claim 1, wherein the energy characteristic is the energy savings.

6. The system of claim 1, wherein each meter's data is averaged over the interval.

7. The system of claim 1, wherein the wherein the interval is a period of twenty-four hours.

8. The system of claim 1, wherein the interval is a period of four hours.

9. The system of claim 1, wherein the interval is a period of one hour.

10. A voltage control and energy conservation system using paired t distributions to calculate a change in energy use or improvement in conservation performance in energy reduction on a system, comprising:
  an electrical energy delivery system with a substation configured as an electrical supply system supplying power through an electrical distribution system to an electrical usage system for use by electrical usage devices at a plurality of user locations;
  a plurality of meters, including a meter located at a supply point at the substation, and at least one meter located at a respective at least one of the plurality of user locations and configured to generate meter data based on a measured component of electrical power received by the meter;
  a voltage controller configured to operate in a conservation-voltage-reduction-on state or in a conservation-voltage-reduction-off state; wherein the voltage controller applies conservation voltage reduction to generate a conservation voltage reduction energy delivery parameter based on the meter data when the controller is in the conservation-voltage-reduction-on state, but not when the controller is in the conservation-voltage-reduction-off state;
  wherein the substation is further configured to adjust a voltage set point value of the electrical power supplied at the supply point to the plurality of user locations based on the energy delivery parameter; and
  wherein the voltage and energy are measured by the meters on an interval basis using an energy validation process, a change in energy characteristics between the voltage conservation-voltage-reduction-on state and the conservation-voltage-reduction-off being determined using a pairing process and a paired t measurement, and wherein the paired t measurement determines an average shift in a mean energy usage,
  wherein the pairing process comprises an additional process that breaks the paired t process into measurements of conservation voltage reduction (CVR) factor and conservation energy savings by season and uses linear regression constants to determine blocks of hours where consistent loads exist and paired t comparisons are configured to be calculated within predetermined limits.

11. A control system for an electric power transmission and distribution grid configured to supply electric power from a supply point to a plurality of user locations, the system comprising:
  a plurality of sensors, wherein each sensor is located at a respective one of a plurality of distribution locations on the distribution grid at or between the supply point and at least one of the plurality of user locations, and wherein each sensor is configured to sense a component of the supplied electric power at the respective distribution location and to generate measurement data based on the sensed component of the power;
  a controller configured to receive measurement data from the plurality of sensors, and to operate the electric power transmission and distribution grid in a modification-on state or in a modification-off state; wherein the controller applies the modification to generate an energy delivery parameter based on the meter data;
  a component adjusting device configured to adjust a component of the electric power transmission and distribution grid in response to the energy delivery parameter;
  wherein the controller is configured to determine, using an energy validation process, a change in energy characteristics between the modification-on state and the modification-off state, using a pairing process and a paired t measurement, and wherein the paired t measurement determines an average shift in a mean energy usage,
  wherein the pairing process comprises an additional process that breaks the paired t process into measurements of conservation voltage reduction (CVR) factor and conservation energy savings by season and uses linear regression constants to determine blocks of hours where consistent loads exist and paired t comparisons are configured to be calculated within predetermined limits.

12. The system of claim 11, wherein the controller applies the modification to generate an energy delivery parameter based on the measurement data when the controller is in the modification-on state, but not when the controller is in the modification-off state.

13. The system of claim 11, wherein the component of the supplied electric power is measured by the sensors on an interval basis.

14. The system of claim 13, wherein each sensor's data is averaged over the interval.

15. The system of claim 13, wherein the wherein the interval is a period of twenty-four hours.

16. The system of claim 13, wherein the interval is a period of four hours.

17. The system of claim 13, wherein the interval is a period of one hour.

18. The system of claim 11, wherein the component of the supplied electric power is voltage.

19. The system of claim 18, wherein the component of the electric power transmission and distribution grid adjusting device comprises: a load tap change transformer that adjusts the voltage of the electric power supplied at the supply point based on a load tap change coefficient; or a voltage regulator that adjusts the voltage of the electric power supplied at the supply point based on the energy delivery parameter.

20. The system of claim 18, wherein the controller is configured to adjust the voltage based on the change in energy characteristic.

21. The system of claim 11, wherein the modification is conservation voltage reduction.

22. The system of claim 11 wherein the energy characteristic is the conservation voltage reduction factor.

23. The system of claim 11, wherein the energy characteristic is the energy savings.

24. The system of claim 11, wherein the controller is configured to use the paired t p-factor to eliminate data having values outside of corresponding predetermined normalized ranges of values to determine measurement accuracy.

25. The system of claim 11, wherein the controller is configured to determine the change in energy characteristic based on a first pairing variable.

26. The system of claim 25, wherein the first variable is season, grouped hour, or customer type.

27. The system of claim 25, wherein the controller is configured to determine the change in energy characteristic based on a second pairing variable that is secondary to the first pairing variable, to pair at least one modification-off value to at least one modification-on value, and to determine a weighed scoring of the at least one pairs based on respective relative slopes of each of the first and second variables and the change in energy characteristic.

28. The system of claim 11, wherein the controller is configured to exclude data that is affected by non-efficiency variables.

29. A method for controlling electrical power supplied to a plurality of distribution locations located at or between a supply point and at least one user location, each of the plurality of distribution locations including at least one sensor configured to sense a voltage of the supplied electric power at the respective distribution location and generate measurement data based on the sensed voltage, the method comprising:
controlling the electric power transmission and distribution grid in a modification-on state or in a modification-off state; wherein a controller applies the modification to generate an energy delivery parameter based on the meter data when the controller is in the modification-on state, but not when the controller is in the modification-off state;
operating an component adjusting device configured to adjust a component of the electric power transmission and distribution grid in response to the energy delivery parameter;
measuring the component of the supplied electric power with the meters on an interval basis using an energy validation process, and determining a change in energy characteristics between the voltage conservation-voltage-reduction-on state and the conservation-voltage-reduction-off state using a pairing process and a paired t measurement, and wherein the paired t measurement determines an average shift in a mean energy usage,
wherein the pairing process comprises an additional process that breaks the paired t process into measurements of conservation voltage reduction (CVR) factor and conservation energy savings by season and uses linear regression constants to determine blocks of hours where consistent loads exist and paired t comparisons are configured to be calculated within predetermined limits.

30. The method of claim 29, wherein the component of the supplied electric power is voltage.

31. The method of claim 29, wherein the modification is conservation voltage reduction.

32. The method of claim 29, wherein the component of the electric power transmission and distribution grid adjusting device comprises: a load tap change transformer that adjusts the voltage of the electric power supplied at the supply point based on a load tap change coefficient; or a voltage regulator that adjusts the voltage of the electric power supplied at the supply point based on the energy delivery parameter.

33. The method of claim 29 wherein the energy characteristic is the conservation voltage reduction factor.

34. The method of claim 29, wherein the energy characteristic is the energy savings.

35. The method of claim 29, wherein each meter's data is averaged over the interval.

36. The method of claim 29, wherein the wherein the interval is a period of twenty-four hours.

37. The method of claim 29, wherein the interval is a period of four hours.

38. The method of claim 29, wherein the interval is a period of one hour.

39. A voltage control and energy conservation system for an electric power transmission and distribution system grid, comprising:
an electrical energy delivery system with a substation configured as an electrical supply system supplying power through an electrical distribution system to an electrical usage system for use by electrical usage devices at a plurality of user locations;
a sensor located at the substation and a sensor located at least one of the plurality of user locations configured to generate sensor data based on a measured component of electrical power received by the respective sensors; and
a voltage controller configured to generate an energy delivery parameter based on the sensor data,
wherein the substation is further configured to adjust a voltage set point value of the electrical power supplied to the plurality of user locations based on the energy delivery parameter, and
wherein the voltage controller is configured to measure the voltage and energy on an interval basis using an energy validation process and the conservation voltage reduction (CVR) factor for at least one CVR "ON" set point and at least one CVR "OFF" set point using a pairing process to determine the CVR factor, wherein the pairing process comprises pairing a CVR "ON" record to a CVR "OFF" record and the CVR "OFF" record has a predetermined first independent variable associated with the CVR "OFF" record within a first independent variable tolerance of the first independent variable associated with the paired CVR "ON" record, wherein voltage controller is further configured to determine an average shift in a mean energy usage using a paired t measurement,
wherein the pairing process comprises an additional process that breaks the paired t process into measurements of conservation voltage reduction (CVR) factor and conservation energy savings by season and uses linear regression constants to determine blocks of hours where consistent loads exist and paired t comparisons are configured to be calculated within predetermined limits.

40. The system of claim 39, wherein the CVR "OFF" record has a second independent variable associated with the CVR "OFF" record within a predetermined second independent variable tolerance of the second independent variable associated with the paired CVR "ON" record.

41. A control system for an electric power grid configured to supply electric power from a supply point to a plurality of consumption locations, the system comprising:
   a plurality of sensors, wherein each sensor is located at a respective one of a plurality of distribution locations on the distribution grid at or between the supply point and at least one of the plurality of consumption locations, and wherein each sensor is configured to sense a component of the supplied electric power received at the respective distribution location and to generate measurement data based on the sensed component of the power;
   a controller configured to receive measurement data from the plurality of sensors, and to operate the electric power grid in a modification-on state or in a modification-off state; wherein the controller generates an energy delivery parameter based on the measurement data;
   a component adjusting device configured to adjust a component of the electric power grid in response to the energy delivery parameter;
   wherein the controller is configured to determine, using an energy validation process, a change in energy characteristics between the modification-on state and the modification-off state, using a pairing process and paired t measurement, wherein the pairing process comprises an additional process that breaks the paired t process into measurements of conservation voltage reduction (CVR) factor and conservation energy savings by season and uses linear regression constants to determine blocks of hours where consistent loads exist and paired t comparisons are configured to be calculated within predetermined limits.

42. The system of claim 41, wherein the controller generates an energy delivery parameter based on the measurement data when the controller is in the modification-on state, but not when the controller is in the modification-off state.

43. The system of claim 41, wherein the component of the supplied electric power is measured by the sensors on an interval basis.

44. The system of claim 43, wherein each sensor's measurement data is averaged over the interval.

45. The system of claim 43, wherein the interval is a period of between about one hour and about twenty-four hours.

46. The system of claim 41, wherein the component of the supplied electric power is voltage.

47. The system of claim 46, wherein the component of the electric power grid adjusting device comprises: a load tap change transformer that adjusts the voltage of the electric power supplied at the supply point based on a load tap change coefficient; or a voltage regulator that adjusts the voltage of the electric power supplied at the supply point based on the energy delivery parameter.

48. The system of claim 47, wherein the load tap change transformer is located at a substation and at least one sensor is located at the substation.

49. The system of claim 46, wherein the controller is configured to adjust the voltage based on the change in energy characteristic.

50. The system of claim 41, wherein the modification is conservation voltage reduction.

51. The system of claim 41, wherein the energy characteristic is the conservation voltage reduction factor.

52. The system of claim 41, wherein the energy characteristic is the energy savings.

53. The system of claim 41, wherein the controller is further configured to receive the measurement data from each sensor of a subset of the plurality of sensors, wherein the subset includes more than one and fewer than all of the plurality of sensors for distribution locations receiving the supplied electric power, and to generate the energy delivery parameter based on the measurement data received from the subset.

54. The system of claim 41, wherein the controller is configured to use the paired t p-factor to eliminate data having values outside of corresponding predetermined normalized ranges of values to determine measurement accuracy.

55. The system of claim 41, wherein the controller is configured to determining the change in energy characteristic based on a first variable.

56. The system of claim 55, wherein the first variable is season, grouped hour, or customer type.

57. The system of claim 55, wherein the controller is configured to provide a second pairing variable that is secondary to the first pairing variable, to pair the first variable values to the closest modification-off to modification-on values, and determining a weighed scoring of the pairs based on relative slopes of the linear relationship between the first and second respective variables.

58. The system of claim 41, wherein the controller is configured to exclude data that is affected by non-efficiency variables.

59. A method for controlling electrical power supplied to a plurality of distribution locations located at or between a supply point and at least one consumption location, each of the plurality of distribution locations including at least one sensor configured to sense a voltage of the supplied electric power received at the respective distribution location and generate measurement data based on the sensed voltage, the method comprising:
   controlling the electric power grid in a modification-on state or in a modification-off state; wherein a controller generates an energy delivery parameter based on the measurement data when the controller is in the modification-on state, but not when the controller is in the modification-off state;
   operating an component adjusting device configured to adjust a component of the electric power grid in response to the energy delivery parameter;
   measuring the component of the supplied electric power with the sensors on an interval basis using an energy validation process, and determining a change in energy characteristics between the voltage conservation-voltage-reduction-on state and the conservation-voltage-reduction-off state using a pairing process and a paired t measurement,
   wherein the pairing process comprises an additional process that breaks the paired t process into measurements of conservation voltage reduction (CVR) factor and conservation energy savings by season and uses linear regression constants to determine the blocks of hours where consistent loads exist and paired t comparisons are configured to be calculated within predetermined limits.

60. The method of claim 59, wherein the component of the supplied electric power is voltage.

61. The method of claim 59, wherein the modification is conservation voltage reduction.

62. The method of claim 59, wherein the component of the electric power grid adjusting device comprises: a load tap change transformer that adjusts the voltage of the electric power supplied at the supply point based on a load tap change coefficient; or a voltage regulator that adjusts the voltage of the electric power supplied at the supply point based on the energy delivery parameter.

63. The method of claim 59, wherein the energy characteristic is the conservation voltage reduction factor.

64. The method of claim 59, wherein the energy characteristic is the energy savings.

65. The method of claim 59, wherein each sensor's measurement data is averaged over the interval.

66. The method of claim 59, wherein the wherein the interval is a period of between about one hour and about twenty-four hours.

67. The method of claim 59, wherein the energy delivery parameter is based on the measurement data received from each sensor of a subset of the plurality of sensors, wherein the subset includes more than one and fewer than all of the plurality of sensors for distribution locations receiving the supplied electric power.

68. A control system for an electric power grid configured to supply electric power from a supply point to a plurality of consumption locations, the system comprising:
- a sensor receiving module configured to receive measurement data from at least one sensor of a subset of a plurality of sensors, the plurality of sensors being located at a respective one of a plurality of distribution locations on the electric power grid at or between the supply point and at least one of the plurality of consumption locations, the measurement data being based on at least one component of the supplied electric power received at the respective distribution location;
- an analysis module configured to generate an energy delivery parameter based on the measurement data received from the subset, and to operate the electric power grid in a modification-on state or in a modification-off state, wherein the analysis module is configured to determine, using an energy validation process, a change in energy characteristics between the modification-on state and the modification-off state, using a pairing process a paired t measurement, wherein the pairing process comprises an additional process that breaks the paired t process into measurements of conservation voltage reduction (CVR) factor and conservation energy savings by season and uses linear regression constants to determine blocks of hours where consistent loads exist and paired t comparisons are configured to be calculated within predetermined limits; and
- an adjusting module configured to cause an adjusting device to adjust a component of the electric power supplied at the supply point based on the energy delivery parameter.

* * * * *